United States Patent
Lee et al.

(10) Patent No.: US 11,031,430 B2
(45) Date of Patent: Jun. 8, 2021

(54) IMAGE SENSOR WITH DUMMY LINES FOR MINIMIZING FIXED PATTERN NOISE (FPN) AND ELECTRONIC APPARATUS INCLUDING THE SAME

(71) Applicant: SAMSUNG ELECTRONICS CO., LTD., Suwon-si (KR)

(72) Inventors: Jae-kyu Lee, Seongnam-si (KR); Young-chan Kim, Seongnam-si (KR); Seung-sik Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/045,985

(22) Filed: Jul. 26, 2018

(65) Prior Publication Data

US 2019/0148438 A1    May 16, 2019

(30) Foreign Application Priority Data

Nov. 16, 2017   (KR) .................. 10-2017-0153316

(51) Int. Cl.
*H01L 27/146*   (2006.01)
*H01L 23/48*    (2006.01)
*H04N 5/365*    (2011.01)

(52) U.S. Cl.
CPC ...... *H01L 27/14636* (2013.01); *H01L 23/481* (2013.01); *H01L 27/14603* (2013.01); *H01L 27/14634* (2013.01); *H01L 27/14641* (2013.01); *H01L 27/14621* (2013.01); *H01L 27/14627* (2013.01); *H04N 5/365* (2013.01)

(58) Field of Classification Search
CPC ............ H01L 23/481; H01L 27/14603; H01L 27/14634; H01L 27/14636; H01L 27/14641
See application file for complete search history.

(56) References Cited

U.S. PATENT DOCUMENTS

| | | | |
|---|---|---|---|
| 4,185,318 A | 1/1980 | Engeler et al. | |
| 6,640,332 B2 | 10/2003 | Mitome et al. | |
| 7,402,811 B2 | 7/2008 | Hatanaka et al. | |
| 8,274,340 B2 | 9/2012 | Guilar | |
| 9,478,569 B2 | 10/2016 | Uesaka et al. | |
| 9,614,525 B2 | 4/2017 | Shiomi et al. | |

(Continued)

FOREIGN PATENT DOCUMENTS

JP    2015-201793 A   11/2015

*Primary Examiner* — Andrew Q Tran
(74) *Attorney, Agent, or Firm* — Lee IP Law, P.C.

(57) ABSTRACT

An image sensor and an electronic apparatus, the image sensor including a plurality of pixels, each pixel of the plurality of pixels including a photodiode and a transfer transistor, a reset transistor, a source-follower transistor, and a selection transistor, which correspond to the photodiode; a plurality of first interconnection lines connected to gates of the transfer transistor, the reset transistor, and the selection transistor, the plurality of first interconnection lines extending in a first direction; and a plurality of second interconnection lines connected to a source region of the selection transistor, the plurality of second interconnection lines extending in a second direction that intersects the first direction, wherein the plurality of second interconnection lines includes dummy lines on a peripheral area that is outside of a pixel area in which the pixels are located.

11 Claims, 21 Drawing Sheets

(56) References Cited

U.S. PATENT DOCUMENTS

| | | | |
|---|---|---|---|
| 2006/0092283 A1* | 5/2006 | Tanizoe | H04N 5/3595 |
| | | | 348/207.99 |
| 2006/0231287 A1 | 10/2006 | Nakayama | |
| 2012/0038809 A1 | 2/2012 | Lee et al. | |
| 2014/0084136 A1 | 3/2014 | Hsieh et al. | |
| 2014/0098271 A1* | 4/2014 | Hagihara | H03M 1/08 |
| | | | 348/302 |
| 2019/0148438 A1* | 5/2019 | Lee | H01L 27/14636 |
| | | | 257/432 |

* cited by examiner

IMAGE SENSOR WITH DUMMY LINES FOR MINIMIZING FIXED PATTERN NOISE (FPN) AND ELECTRONIC APPARATUS INCLUDING THE SAME

CROSS-REFERENCE TO RELATED APPLICATION

Korean Patent Application No. 10-2017-0153316, filed on Nov. 16, 2017, in the Korean Intellectual Property Office, and entitled: "Image Sensor and Electronic Apparatus Including the Same," is incorporated by reference herein in its entirety.

BACKGROUND

1. Field

Embodiments relate to an image sensor and an electronic apparatus including the same.

2. Description of the Related Art

An image sensor may include a plurality of unit pixels arranged in a two-dimensional (2D) array. A unit pixel may include one photodiode and a plurality of pixel transistors. The pixel transistors may include, e.g., a transfer Transistor (TG), a reset transistor (RG), a source-follower transistor (SF), and/or a selection transistor (SEL).

SUMMARY

The embodiments may be realized by providing an image sensor including a plurality of pixels, each pixel of the plurality of pixels including a photodiode and a transfer transistor, a reset transistor, a source-follower transistor, and a selection transistor, which correspond to the photodiode; a plurality of first interconnection lines connected to gates of the transfer transistor, the reset transistor, and the selection transistor, the plurality of first interconnection lines extending in a first direction; and a plurality of second interconnection lines connected to a source region of the selection transistor, the plurality of second interconnection lines extending in a second direction that intersects the first direction, wherein the plurality of second interconnection lines includes dummy lines on a peripheral area that is outside of a pixel area in which the pixels are located.

The embodiments may be realized by providing an image sensor including an upper chip that includes a plurality of pixels arranged in a two-dimensional (2D) array, a plurality of row lines and a plurality of column lines being arranged on the upper chip, the plurality of row lines extending in a first direction, the plurality of column lines extending in a second direction that intersects the first direction; and a lower chip under the upper chip, logic devices for signal processing operations being arranged on the lower chip, wherein the plurality of column lines are connected to source regions of selection transistors of the respective pixels and have a same length in the second direction.

The embodiments may be realized by providing an electronic apparatus including an optical system; an image sensor; and a signal processing circuit, wherein the image sensor includes an upper chip that includes a plurality of pixels arranged in a two-dimensional (2D) array, a plurality of row lines and a plurality of column lines being arranged on the upper chip, the plurality of row lines extending in a first direction, and the plurality of column lines extending in a second direction intersecting the first direction; and a lower chip under the upper chip, logic devices for signal processing operations being arranged on the lower chip, and wherein the plurality of column lines are connected to source regions of selection transistors of the respective pixels and have a same length in the second direction.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
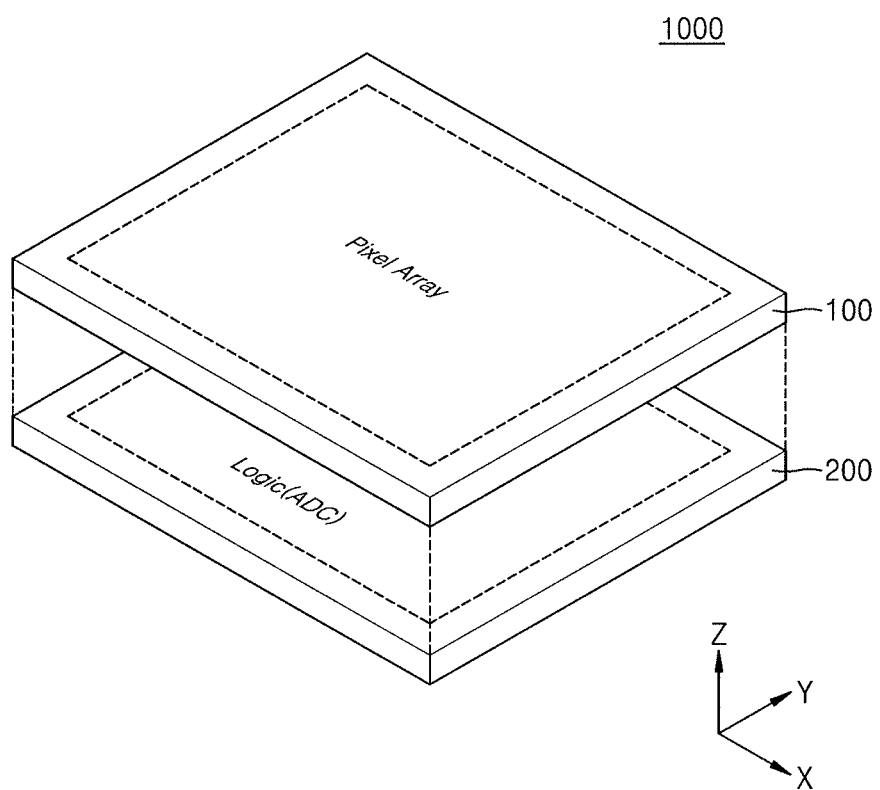
FIG. 1A illustrates a perspective view of an image sensor according to an embodiment, in which an upper chip including pixels is separated from a lower chip including logic devices.
Figure 1B:
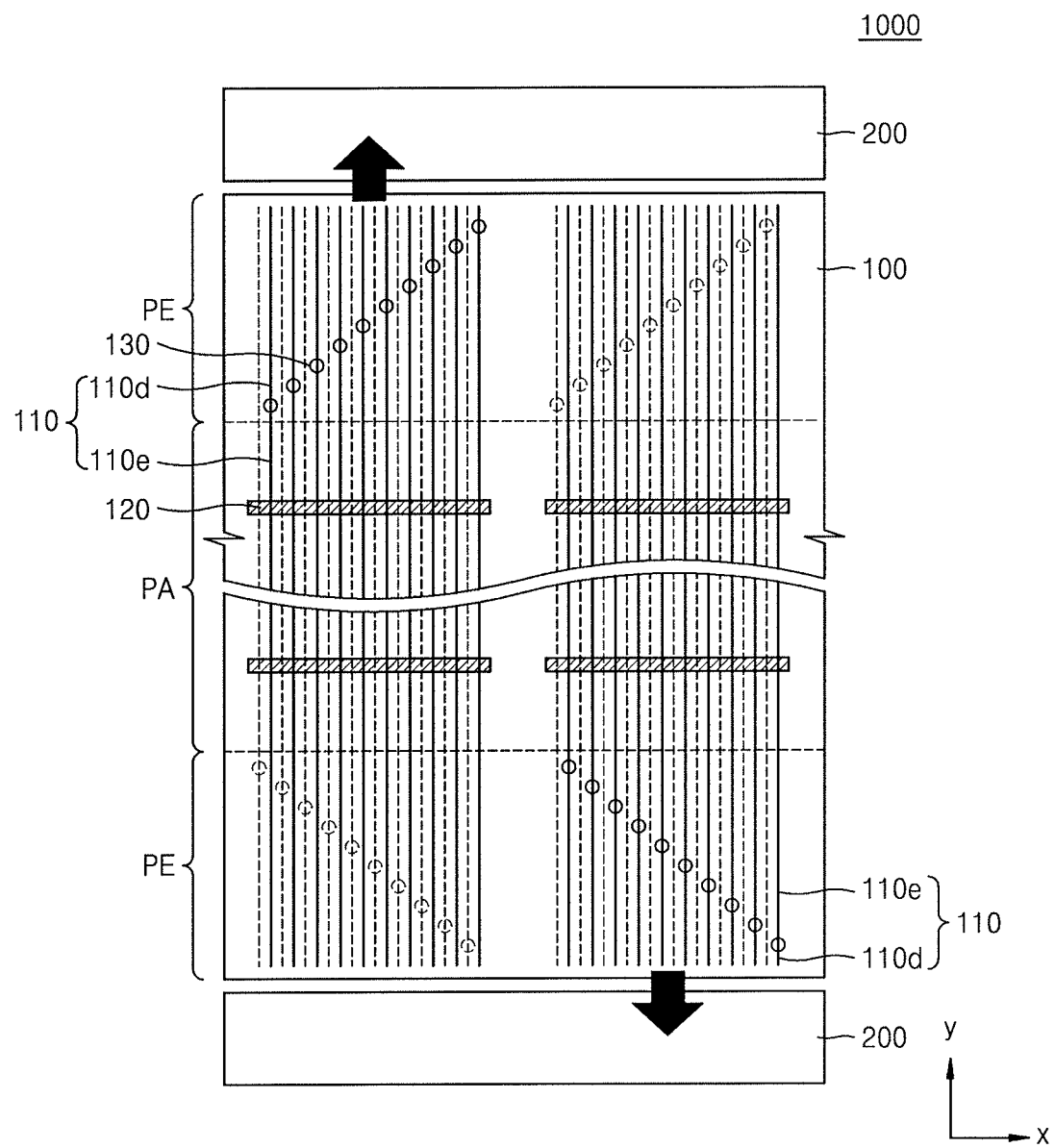
FIG. 1B illustrates a conceptual diagram of a structure of column lines of a pixel area in the upper chip of the image sensor of FIG. 1A.

FIG. 1A illustrates a perspective view of an image sensor 1000 according to an embodiment, in which an upper chip 100 including pixels is separated from a lower chip 200 including logic devices. FIG. 1B illustrates a conceptual diagram of a structure of column lines of a pixel area PA in the upper chip 100 of the image sensor 1000 of FIG. 1A.

Referring to FIGS. 1A and 1B, the image sensor 1000 of the present embodiment may have a structure in which the upper chip 100 is stacked on the lower chip 200. A plurality of pixels may be arranged in a two-dimensional (2D) array on the upper chip 100. According to an embodiment, the upper chip 100 may include the pixel area PA and a peripheral area PE. A plurality of pixels may be arranged in a 2D array in the pixel area PA, and interconnections, contacts, and through vias may be located in the peripheral area PE to electrically connect the upper chip 100 with the lower chip 200. In FIG. 1A, a portion indicated by 'Pixel Array' inside a quadrangle illustrated with a dashed line may correspond to the pixel area PA, and a portion outside the quadrangle may correspond to the peripheral area PE.

As shown in FIG. 1B, a plurality of column lines 110 may be located on the upper chip 100 and extend (e.g., lengthwise) in a second direction (y direction). The column lines 110 may be connected to the pixels and signals from the pixels may be output through the column lines 110. The pixels located on the upper chip 100 and the column lines 110 connected to the pixels will be described in further detail below with reference to FIG. 2A.

The column lines 110 may extend to the peripheral area PE and the pixel area PA and may be connected to through vias 130 in the peripheral area PE. The through vias 130 may be also referred to as through-silicon vias (TSVs) in the sense that the through vias 130 penetrate a silicon substrate. Also, when the through vias 130 penetrate a back side of the silicon substrate, the through vias 130 may be referred to as back-via silicons (BVSs). By using the through vias 130, the column lines 110 may be electrically connected to logic devices (e.g., analog-to-digital converters (ADCs)) of the lower chip 200.

As shown in FIG. 1B, a predetermined number of through vias 130 and a predetermined number of column lines 110 connected to the through vias 130 may repetitively form groups. In an implementation, the column lines 110 may be alternately connected to a through via 130 located on an upper side and a through via 130 located on a lower side, in the second direction (y direction). In a first group, column lines 110 connected to through vias 130 located on the upper side may be indicated by solid lines, while column lines 110 connected to through vias 130 located the lower side may be indicated by dashed lines. In a second group, column lines 110 connected to through vias 130 located on the upper side may be indicated by dashed lines, while column lines 110 connected to the through vias 130 located on the lower side may be indicated by solid lines. The column lines 110 connected to the through vias 130 located on the upper side and the column lines 110 connected to the through vias 130 located on the lower side are distinguishably displayed in the above-described manner to easily explain the concept of column fixed-pattern noise (CFPN) in the following descriptions of FIGS. 2A and 2B and 4A to 4C. Also, in the following drawings, the column lines 110 indicated by the dashed lines and the through vias 130 corresponding thereto may be omitted for brevity.

In the image sensor 1000 of the present embodiment, ten (10) through vias 130 located on the upper side and ten through vias 130 located on the lower side may form one group. In an implementation, twenty (20) column lines 110 corresponding to the ten through vias 130 located on the upper side and the ten through vias 130 located on the lower side may be included in the one group. In an implementation, the through vias 130 and the column lines 110 included in one group may be a number other than 20.

Although the lower chip 200 is illustrated at each of an upper side and a lower side of FIG. 1B, this does not mean that two lower chips 200 are provided, and the column lines 110 may be connected to the lower chip 200 through the through vias 130 located on the upper side, and the column lines 110 may be connected to the lower chip through the through vias 130 located on the lower side. Accordingly, the lower chip 200 located on the upper side and the lower chip 200 located on the lower side may be the same lower chip 200. In FIG. 1B, reference numeral '120' may denote elements (e.g., vertical contacts) configured to connect the column lines 110 with pixels. However, the vertical contacts 120 are conceptual indications for connection between the column lines 110 with the pixels. Actual positions or structures of the vertical contacts 120 may be different from those shown in FIG. 1B, and the vertical contacts are not connected to each other in a first direction (x direction).

In the image sensor 1000 of the present embodiment, each of the column lines 110 may include an effective column line 110e and a dummy column line 110d. The effective column line 110e may refer to a portion of the column line 110 extending from the pixel area PA to the through via 130 of the peripheral area PE, and the dummy column line 110d may refer to a portion of the column line 110 that is connected to the effective column line 110e and extends beyond the through via 130 in the second direction (y direction, e.g., away from the pixel area PA). In an implementation, as shown in FIG. 1B, each of the column lines 110 may include the dummy column line 110d. In an implementation, only some of the column lines 110 may include the dummy column line 110d. For example, a longest column line of the column lines 110 may not include the dummy column line 110d.

In the image sensor 1000 of the present embodiment, the column lines 110 may include the dummy column lines 110d, and may have substantially the same overall length in the second direction (y direction). Thus, a column line 110 having a relatively short effective column line 110e may include a relatively long dummy column line 110d, while a column line 110 having a relatively long effective column line 110e may include a relatively short dummy column line 110d. Therefore, in the image sensor 1000 of the present embodiment, the column lines 110 may include the dummy column lines 110d, and signals output by the pixels may be uniformized. The uniformization of signals due to the structure of the column lines 110 will be described in further detail below with reference to FIGS. 2A and 2B.

In an implementation, a plurality of row lines, which are connected to the pixels and extend (e.g., lengthwise) in the first direction (x direction), may be located in the upper chip 100. Signals may be transmitted to the pixels through the row lines. The row lines located in the upper chip 100 will be described in further detail below with reference to FIGS. 10 and 11.

The lower chip 200 may include logic devices. In an implementation, the lower chip 200 may further include memory devices. The lower chip 200 may be located under the upper chip 100 and electrically connected to the upper chip 100 through the through vias 130. Thus, signals may be transmitted between the upper chip 100 and the lower chip 200. A stack structure of the upper chip 100 and the lower chip 200 will be described in further detail below with reference to FIGS. 11A and 11B.

The logic devices of the lower chip 200 may include various circuits configured to process signals from the pixels of the upper chip 100. In an implementation, the logic devices may include, e.g., an analog signal processing circuit, an ADC circuit, an image signal processing circuit, or a control circuit.

In an implementation, a structure of the image sensor 1000 of the present embodiment may be a double stack structure in which the upper chip 100 is stacked on the lower chip 200. In an implementation, the image sensor of the present embodiment may have a triple stack structure including three stacked chips or a quadruple stack structure including four stacked chips. In the image sensor having the triple stack structure or the quadruple stack structure, an ADC circuit or memory devices may be formed on an additional chip and stacked. In an implementation, the image sensor 1000 of the present embodiment may be, e.g., a complementary metal-oxide-semiconductor (CMOS) image sensor (CIS).

In the case of an image sensor (e.g., a CIS) operating at high speed, a difference in settling time may occur between adjacent column lines. The difference in settling time may be caused by a difference in length between metal lines used for signal transmission. The longer the length of a metal line, the longer the setting time due to an increase in an RC time constant. In the image sensor 1000 of the present embodiment, the column lines 110 may include the dummy column lines 110d and have the same length so that the column lines 110 may have substantially the same capacitance. Thus, the column lines 110 may have the same resistive-capacitive (RC) delay, thereby uniformizing signal transmission characteristics. As a result, the image sensor 1000 of the present embodiment may uniformly maintain a settling time of an output signal based on the sameness of the RC delay of the column lines 110. Thus, column fixed pattern noise (CFPN) may be minimized. Accordingly, the image sensor 1000 of the present embodiment may provide improved images of which noise is minimized.

Fixed pattern noise (FPN) may occur in an image sensor (e.g., a CIS). In dark conditions without light, pixels having different output values may be generated. This phenomenon may be called "dark signal non-uniformity (DSNU)." Also, when light exists, pixels may have respectively different output values based on a degree to which each of the pixels responds to the light. This phenomenon may be called "photo-response non-uniformity". Typically, FPN may refer to DSNU. Also, FPN may be divided into column fixed pattern noise (CFPN) caused to column lines and row fixed pattern noise (RFPN) caused to row lines. Here, the CFPN may be expressed by Equation (1):

$$CFPN=1/FSD*[1/(M-1)*\Sigma(C_i-C_{i+1})^2]^{1/2} \quad (1).$$

wherein i denotes a number of a column line, i ranges from 0 to M−2 in Σ, and $C_i$ is an output voltage of an i-th column line. Also, FSD denotes an acronym of Full-Scale Deflection and may correspond to a normalizing constant. From Equation (1), it can be seen that CFPN occurs mainly due to a difference in output voltage between adjacent column lines. For example, as the difference in output voltage between the adjacent column lines increases, the CFPN may also increase. The output voltage may refer to an output voltage in a settling time. In the image sensor 1000 of the present embodiment, lengths of the column lines 110 may be equal to each other by adding the length of the dummy column lines 110d to the length of the effective column lines 110e. Thus, capacitances of the column lines 110 may be substantially equal to each other to thereby uniformize the setting time and minimize CFPN.

Figure 2A:
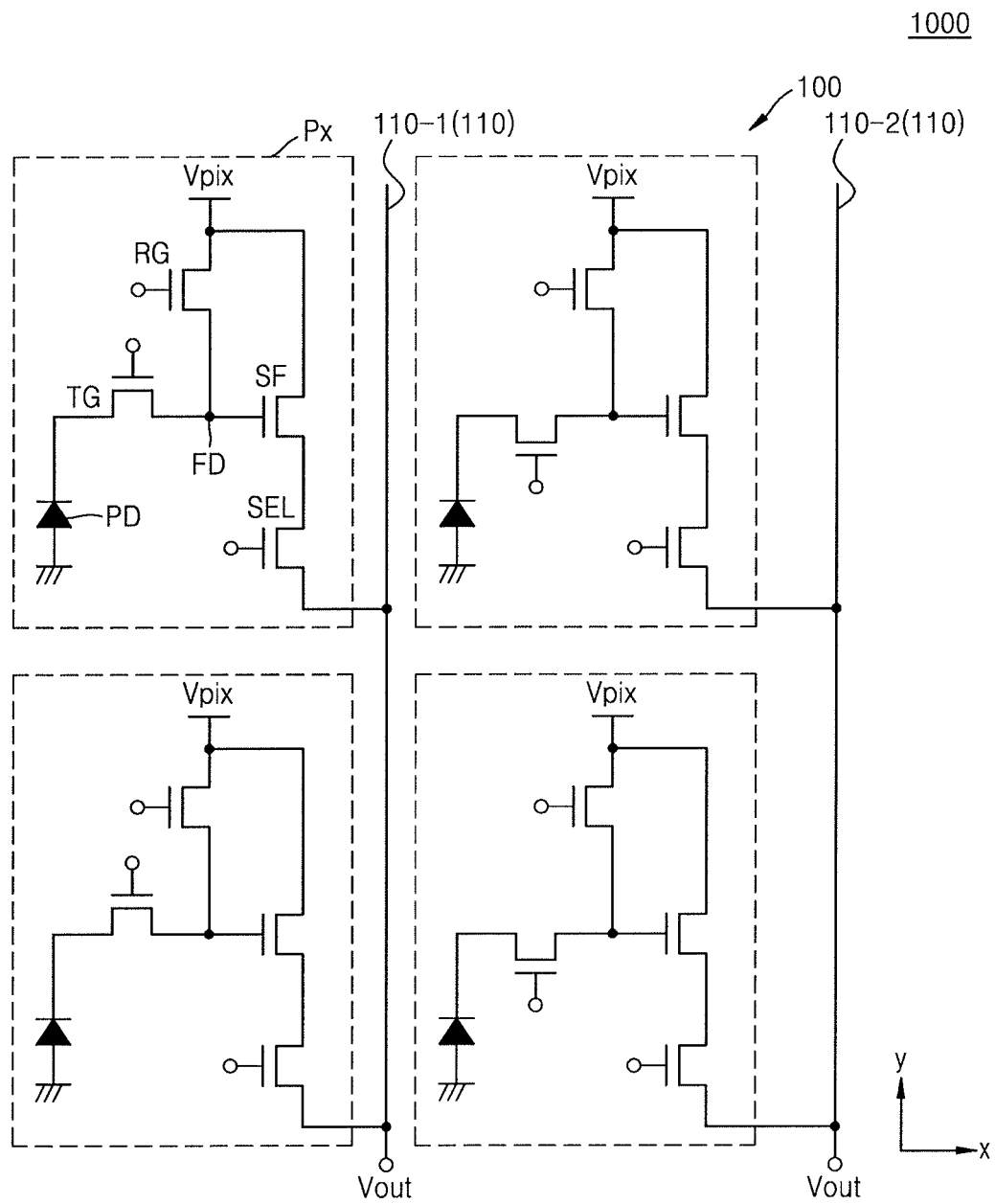
FIG. 2A illustrates a circuit diagram of pixels of the image sensor of FIG. 1A.
Figure 2B:
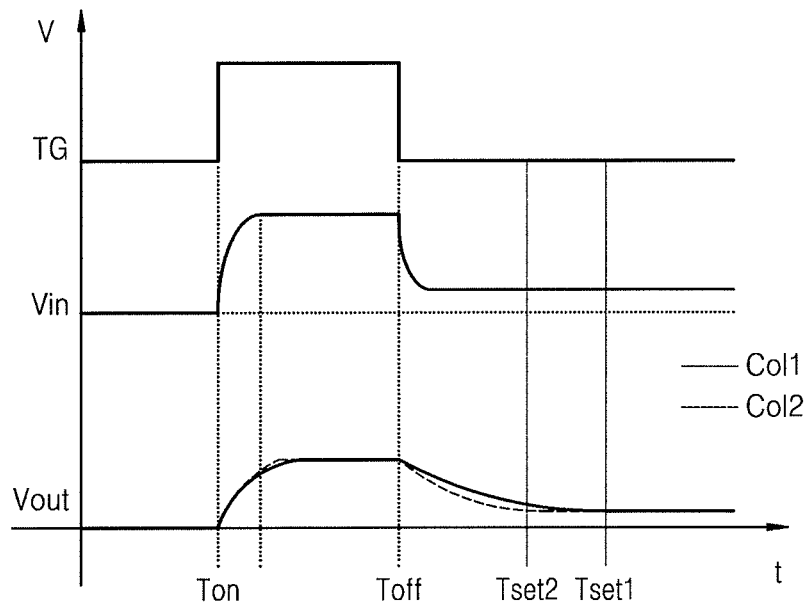
FIG. 2B illustrates a signal waveform diagram showing the concept of a settling time of an output voltage in the circuit diagram of FIG. 2A.

FIG. 2A illustrates a circuit diagram of pixels of an image sensor 1000 of FIG. 1A. FIG. 2B illustrates a signal waveform diagram showing the concept of a settling time of an output voltage in the circuit diagram of FIG. 2A.

Referring to FIGS. 2A and 2B, in the image sensor 1000 of the present embodiment, the upper chip 100 may include a plurality of pixels Px located in a pixel area PA. Also, each of the pixels Px may include a pixel area (refer to PAp in FIG. 5B) and a transistor area (refer to PAt in FIG. 5B). For example, a photodiode PD, a transfer transistor TG, and a floating diffusion region FD may be located in the pixel area of the pixel Px, while a reset transistor RG, a source-follower transistor SF, and a selection transistor SEL may be located in the transistor area of the pixel Px.

Four pixels Px shown in FIG. 2A may be some of the pixels Px. Several hundreds of thousands of pixels Px or several millions of pixels Px may be located in a 2D array in the pixel area PA of the upper chip 100 in a first direction (x direction) and a second direction (y direction). A transfer transistor TG, a reset transistor RG, a source-follower transistor SF, and a selection transistor SEL may be referred to as pixel transistors.

A photodiode PD, which is a P-N junction diode, may generate charges, for example, negative charges (or electrons) or positive charges (or holes), in proportion to the amount of incident light. The transfer transistor TG may transit the charges generated by the photodiode PD to the floating diffusion region FD, and the reset transistor RG may periodically reset the charges stored in the floating diffusion region FD. Also, the source-follower transistor SF may serve as a buffer amplifier to buffer a signal corresponding to the charges filled in the floating diffusion region FD, and the selection transistor SEL may serve as a switch to select the pixel corresponding thereto. A column line 110 may be connected to a source region of the selection transistor SEL, and a voltage of the source region of the selection transistor SEL may be output as an output voltage Vout through the column line 110.

Meanwhile, the output voltage Vout may have a short settling time to implement a high-speed image sensor. The settling time of the output voltage Vout may be determined by an RC delay of an output voltage (Vout) line. A capacitance component of the RC delay may be most affected by a capacitance of the output voltage (Vout) line, for example, the column line 110, while a resistance component of the RC delay may be most affected by an output resistance of the source-follower transistor SF. Differences in capacitance among the column lines 110 may occur mainly due to differences in length among the column lines 110. Accordingly, assuming that output resistances of the source-follower transistors SF are constant to some extent, the differences in capacitance among the column lines 110 may be minimized by minimizing the differences in length among the column lines 110 so that the differences in RC delay among output voltages Vout may be minimized.

The settling time of the output voltage Vout will now be briefly described with reference to the signal waveform diagram of FIG. 2B. When the transfer transistor TG is turned at on-time Ton and turned off at off-time Toff, a drain voltage, e.g., a voltage of the floating diffusion region FD or a gate voltage Vin of the source-follower transistor SF may have a relatively small RC delay as can be seen from a middle signal waveform diagram. In contrast, as can be seen from a lowermost signal waveform diagram, the output voltage Vout may have a relatively large RC delay. In the lowermost signal waveform diagram, a solid line Col1 and a dashed line Col2 may be respectively signal waveform diagrams of output voltages Vout of a first column line 110-1 and a second column line 110-2 in FIG. 2A. In addition, it is assumed that a certain length difference is between the first column line 110-1 and the second column line 110-2.

A settling time may refer to a time duration taken for a difference between the output voltage Vout and a final normal state value to fall within a required percentage (%) range. For example, when it is required for the difference to fall within a range of about 1%, the settling time may be set to about 5 times a time constant ($\tau$=RC). In the lowermost signal waveform diagram, a difference in RC delay may occur due to a difference in length between the first and second column lines 110-1 and 110-2. As a result, a difference in set settling times Tset1 and Tset2 may also occur. However, even if there is the difference in RC delay, when one settling time is commonly applied to both the column lines 110-1 and 110-2, e.g., when a second settling time Tset2 is applied as a common settling time, an output voltage of the first column line 110-1 may be determined in a time other than a normal settling time and become different from an output voltage of the second column line 110-2. As described above, since CFPN is DSNU, output voltages of adjacent column lines should be substantially the same. However, a difference in output voltage between the adjacent column lines may occur due to the application of a common settling time, thus resulting in the occurrence of CFPN. For example, when a difference in length between the adjacent column lines is large, differences in capacitance and RC delay between the adjacent column lines may increase and thus, CFPN may worsen.

Figure 3A:
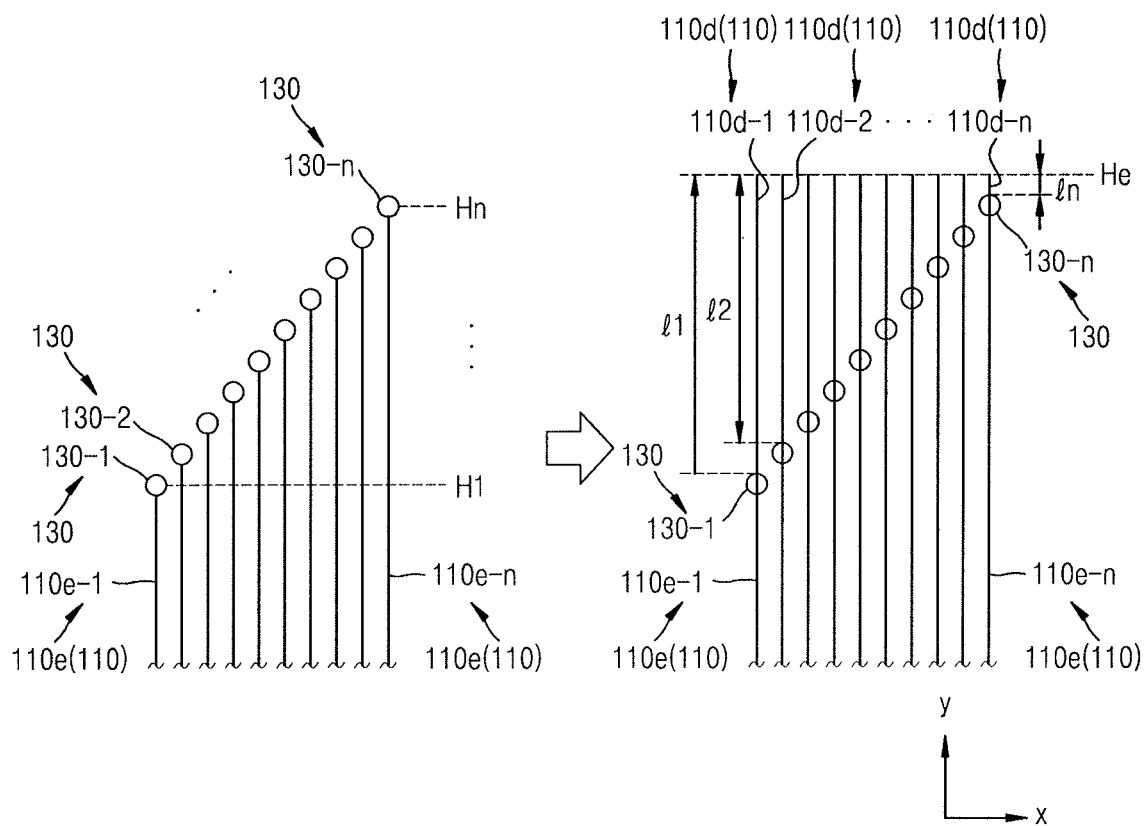
FIGS. 3A and 3B respectively illustrate a conceptual diagram and a perspective view of connection portions between the structure of the column lines of FIG. 1B and through vias.
Figure 3B:
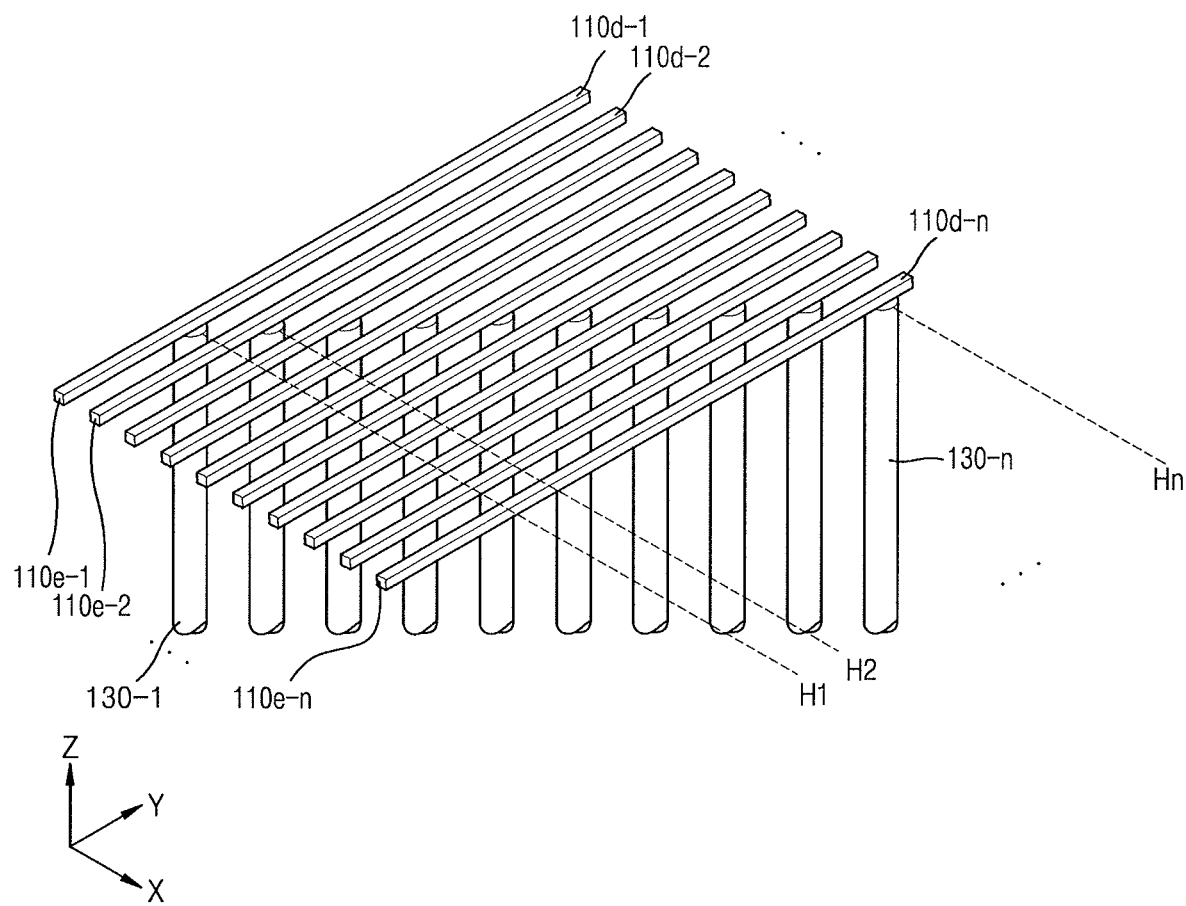

FIG. 3A illustrates a conceptual diagram of connection portions between the column lines and the through vias in the structure of the column lines 110 of FIG. 1B. FIG. 3B illustrates a perspective view corresponding to a right drawing of FIG. 3A.

Referring to FIGS. 3A and 3B, a left drawing of FIG. 3A is a reference drawing of a structure in which the column lines 110 include only the effective column lines 110e but not include dummy column lines, while the right drawing of FIG. 3A, which corresponds to FIG. 1B, is a drawing of a structure in which the column lines 110 includes the effective column lines 110e and the dummy column lines 110d. As described above, only the column lines 110 connected to through vias 130 located on an upper side in a second direction (y direction) are illustrated, and the column lines 110 connected to the through vias 130 located on a lower side in the second direction (y direction) are omitted.

The through vias 130 may be arranged along a first direction (x direction) to be gradually away from or periodically or regularly spaced farther from the pixel area (refer to PA in FIG. 1B) in the second direction (y direction). Thus, even if a fine position difference is between a first through via 130-1 located in a first position H1 and a second through via 130-2 located in a second position H2 in the second direction (y direction), a maximum position difference, which corresponds to about n times a position difference between adjacent through vias, may occur between the first through via 130-1 and an n-th through via 130-n located in a final n-th position Hn. For reference, the reason why the through vias 130 are not arranged in a line along the first direction (x direction) but arranged away from the pixel area in the second direction (y direction) will now be described. For example, as can be seen from FIG. 3B, a size (i.e., diameter or width) of the through vias 130 may be greater than that of the column lines 110, and if the through vias 130 were to be arranged in a line in the first direction (x direction), a process margin may be deficient, and an electrical short could occur between adjacent through vias 130.

As described above, a predetermined number of through vias 130 may repetitively form groups. Accordingly, a first group of n-th through vias 130-n may be adjacent to a second group of first through vias 130-1, but there may be a maximum position difference therebetween in the second direction (y direction). Also, a difference between a length of an n-th effective column line 110e-n connected to the first group of n-th through vias 130-n and a length of a first effective column line 110e-1 of the second group of first through vias 130-1 may be maximized. Thus, if the column lines 110 were to not include dummy column lines as in the left drawing of FIG. 3A, CFPN given by Equation (1) may increase due to the difference in length between adjacent column lines 110 between the groups.

In contrast, when the column lines 110 include the dummy column lines 110d, as in the right drawing of FIG. 3A, the column lines 110 may have substantially the same length regardless of positions of the through vias 130. For example, a first dummy column line 110d-1 connected to the first effective column line 110e-1 (that has the smallest length) may have a first length l1, which is the greatest length, a second dummy column line 110d-2 connected to a second effective column line 110e-2 (that has the second smallest length) may have a second length l2, which is the second greatest length, and an n-th dummy column line 110d-n connected to the final n-th effective column line 110e-n (that has the greatest length) may have an n-th length ln, which is the smallest length. Also, all the column lines 110 may include the dummy column lines 110d and extend to an extension position He in the second direction (y direction) so that all the column lines 110 may have substantially the same length.

Meanwhile, when the column lines 110 have substantially the same length, the column lines 110 may have substantially the same capacitance and substantially the same RC delay. As a result, the column lines 110 may have substantially the same settling time. Accordingly, a difference in output voltage between adjacent column lines 110 may be minimized, thereby minimizing CFPN.

In an implementation, there may not be a dummy column line corresponding to the longest effective column line. For example, when the extension position He is substantially the same as a position of the n-th through via 130-n, the n-th dummy column line may not be present. Also, the lengths of other dummy column lines may be adjusted according to the extension position He.

Figure 4A:
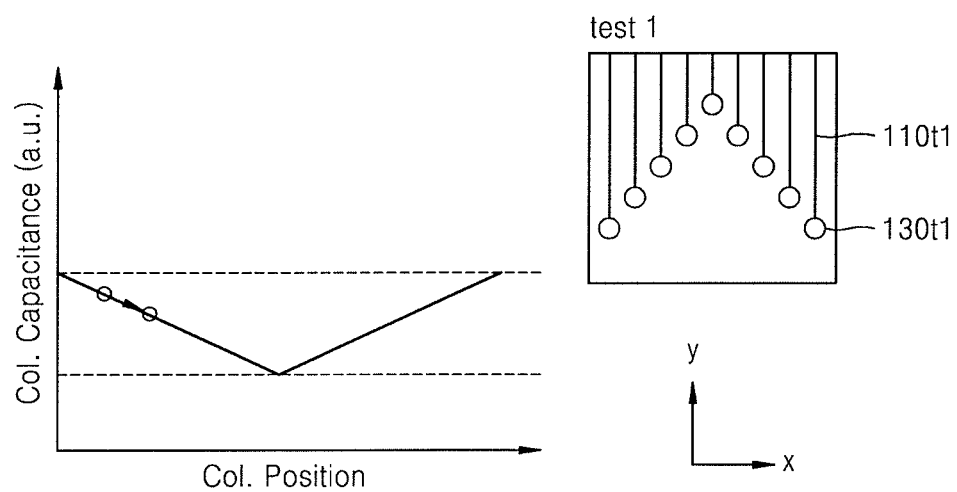
FIGS. 4A to 4C illustrate graphs of capacitances of column lines with respect to positions of through vias and structures of column lines connected to the through vias in test 1, test 2, and test 3, respectively.
Figure 4B:
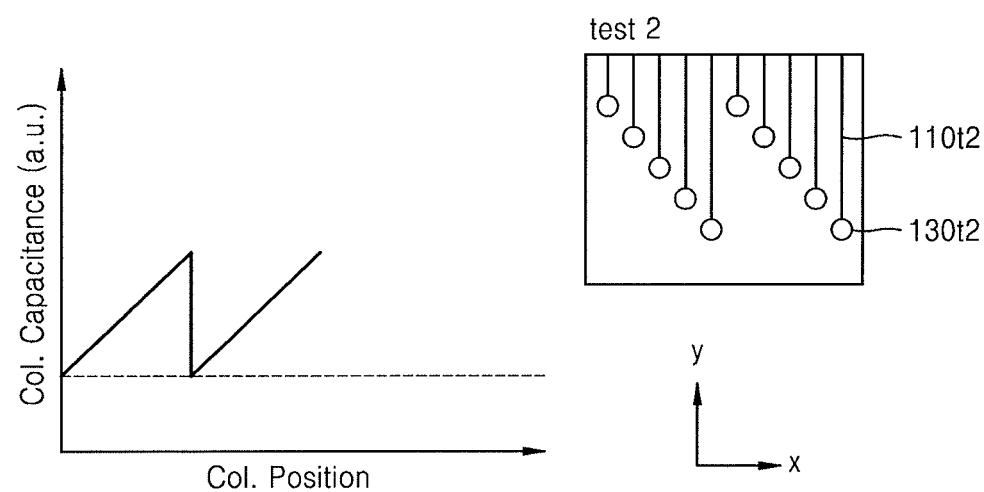
Figure 4C:
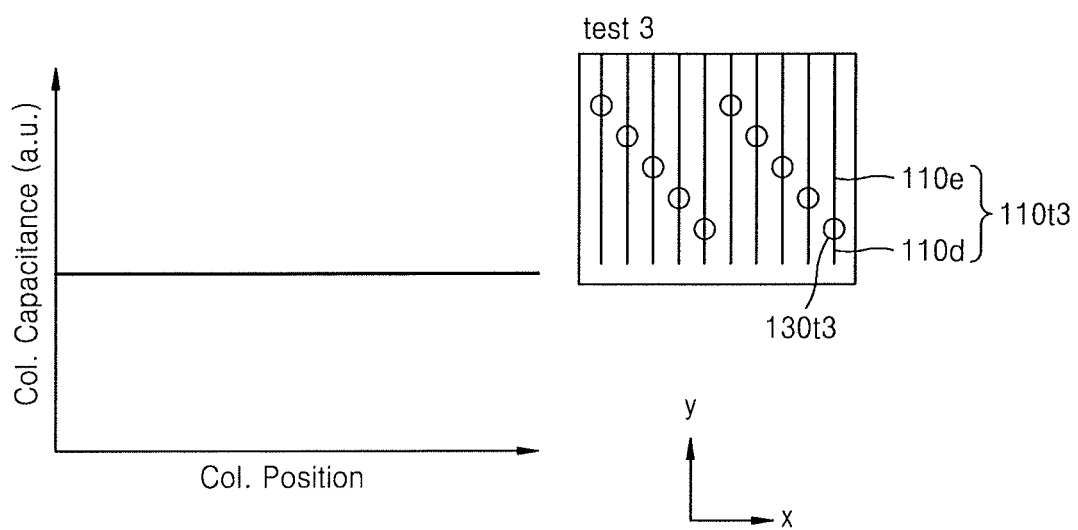
Figure 4D:
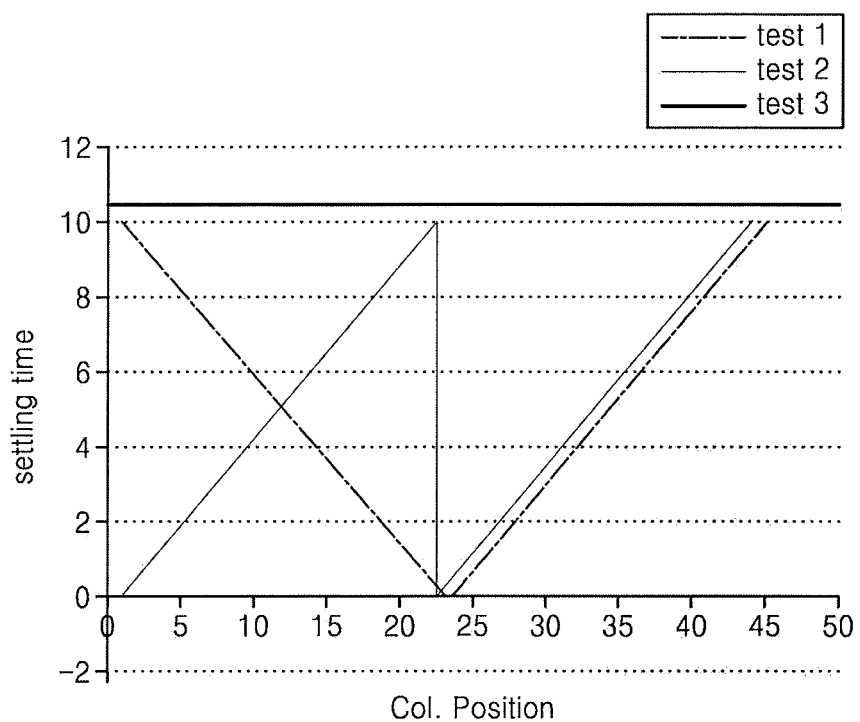
FIG. 4D illustrates a graph showing settling times corresponding to connection structures of test 1, test 2, and test 3 of FIGS. 4A to 4C.
Figure 4E:
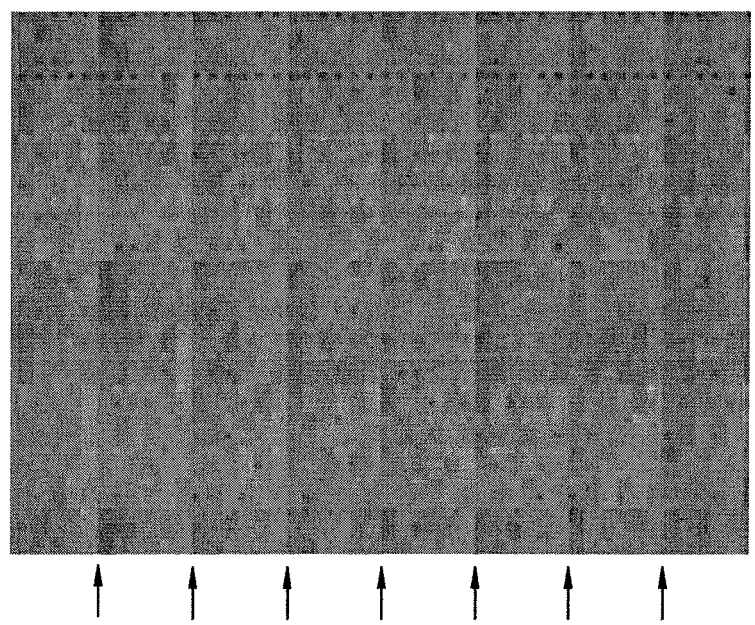
FIG. 4E illustrates an image of a column fixed-pattern noise (CFPN) phenomenon in the connection structure of test 2 of FIG. 4B.

FIGS. 4A to 4C illustrate graphs of capacitances of column lines with respect to positions of through vias and structures of column lines connected to the through vias in test 1, test 2, and test 3, respectively. FIG. 4D illustrates a graph showing settling times corresponding to connection structures of test 1, test 2, and test 3 of FIGS. 4A to 4C. FIG. 4E illustrates an image of a CFPN phenomenon in the connection structure of test 2 of FIG. 4B.

Referring to FIG. 4A, as shown in a square indicated by test 1, through vias 130t1 may be arranged in the form of a caret (^). Thus, the column lines 110t1 connected to the through vias 130t1 gradually shorten and then gradually lengthen, and capacitances of the column lines 110t1 corresponding to the lengths of the column lines 110t1 may gradually decrease and then gradually increase.

Referring to FIG. 4B, as shown in a square indicated by test 2, groups of through vias 130t2 may be repeated, and the through vias 130t2 included in each group may be arranged along a first direction (x direction) and gradually extend farther away from a top side of the square in a second direction (y direction). Thus, the column lines 110t2 connected to the through vias 130t2 may gradually lengthen, return to an initially short state, and then gradually lengthen again, and capacitances of the column lines 110t2 corresponding to the lengths of the column lines 110t2 may gradually increase, abruptly decrease, and then gradually increase again. Positions of the through vias 1301t2 and the connection structures of the through vias 130t2 with the column lines 110t2 shown in FIG. 4B may correspond to the left drawing of FIG. 3A.

Referring to FIG. 4C, as shown in a square indicated by test 3, through vias 130t3 may be arranged in the same manner as in FIG. 4B. However, the column lines 110t3 may include effective column lines 110e and dummy column lines 110d and may have substantially the same length, and capacitances of the column lines 110t3 corresponding to the lengths of the column lines 110t3 may be substantially equal. Positions of the through vias 130t3 and the connection structures of the through vias 130t3 with the column lines 110t3 shown in FIG. 4C may correspond to the right drawing of FIG. 3A.

Referring to FIG. 4D, assuming that a settling time is proportional to an RC time constant and a resistance component is constant to some extent, it may be seen that settling times corresponding to the positions of the through vias 130t1, 130t2, and 130t3 and the structures of column lines 110t1, 110t2, and 110t3 connected to the through vias 130t1, 130t2, and 130t3 in test 1, test 2, and test 3 assume almost similar shapes to the graphs of the capacitances of the column lines 110t1, 110t2, and 110t3 of FIGS. 4A to 4C. For example, settling times of the column lines 110t1 in test 1 may gradually decrease and then gradually increase, and settling times of the column lines 110t2 in test 2 may gradually increase, abruptly decrease, and then increase again. Settling times of the column lines 110t3 in test 3 may be maintained substantially the same.

Referring to FIG. 4E, stripes may be observed in portions indicated by arrows. Striped portions may be a result of an increase in CFPN caused by a sharp difference in length between adjacent column lines between groups. Accordingly, in the image sensor 1000 of the present embodiment, the column lines 110 may include the dummy column lines 110d and may have substantially the same length. Thus, CFPN may be improved so that the image sensor 1000 of the present embodiment may provide images with minimized noise.

Figure 5A:
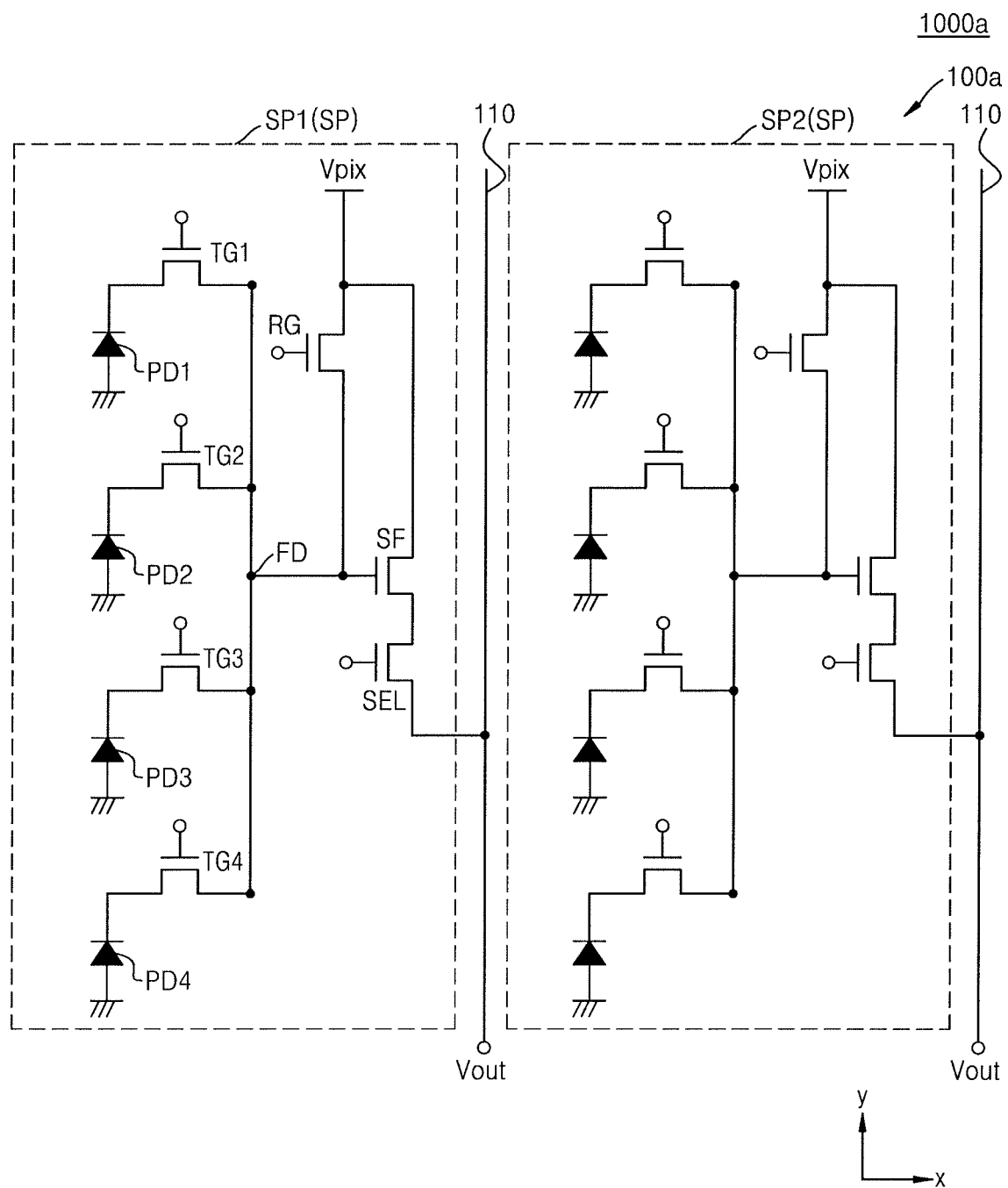
FIG. 5A illustrates a circuit diagram of shared pixels of an image sensor according to an embodiment.
Figure 5B:
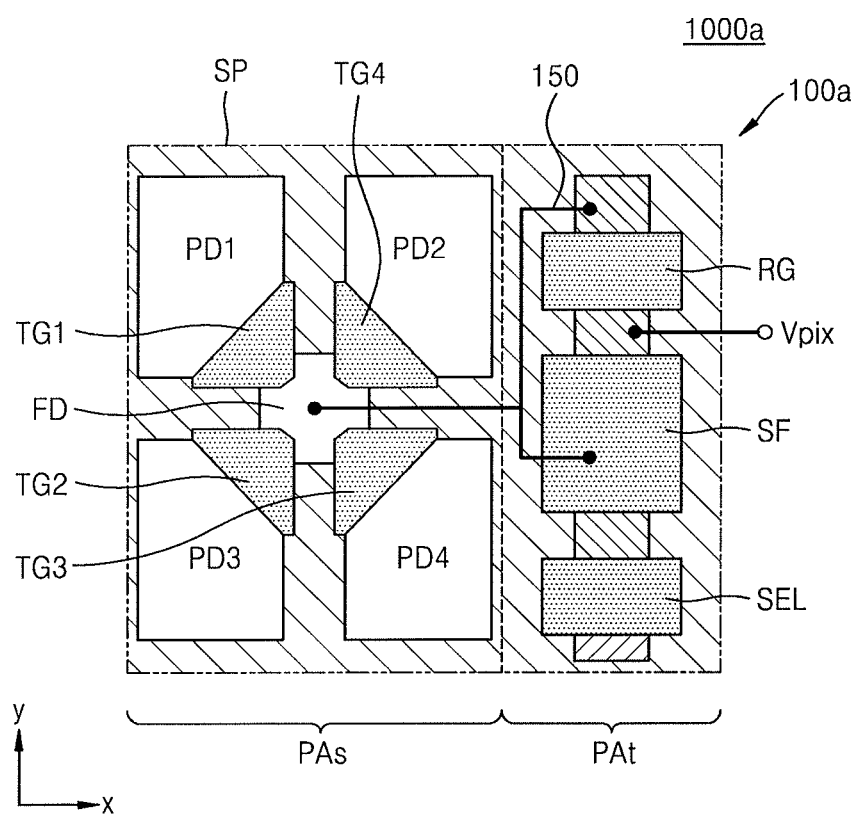
FIG. 5B illustrates a schematic plan view of one shared pixel in the circuit diagram of FIG. 5A.

FIG. 5A illustrates a circuit diagram of shared pixels SP of an image sensor 1000a according to an embodiment. FIG. 5B illustrates a schematic plan view of one shared pixel in the circuit diagram of FIG. 5A.

Referring to FIGS. 5A and 5B, in the image sensor 1000a of the present embodiment, a plurality of shared pixels SP may be arranged in a 2D array in a pixel area (refer to PA in FIG. 1B) of an upper chip 100a. Although FIG. 5A illustrates two shared pixels SP1 and SP2, a plurality of shared pixels SP may be actually arranged in a 2D array in the pixel area PA of the upper chip 100a in a first direction (x direction) and a second direction (y direction).

Each of the shared pixels SP may include a pixel shared area PAs and a transistor area PAt. Four pixels may be arranged in the pixel shared area PAs, and transistors RG, FS, and SET excluding transfer transistors TG may be arranged in the transistor area PAt. In the image sensor 1000a of the present embodiment, one photodiode PD may correspond to one pixel. Thus, unless specifically described otherwise below, the photodiode PD and the pixel will be treated as the same concept.

In the image sensor 1000a of the present embodiment, four pixels may constitute one shared pixel SP. For example, the shared pixel SP may have a structure in which four photodiodes PD1 to PD4 surround and share one floating diffusion region FD. In one shared pixel SP, as can be seen from the circuit diagram of FIG. 5A, one floating diffusion region FD may be shared among the four photodiodes PD1 to PD4 due to transfer transistors TG1 to TG4 corresponding respectively to the photodiodes PD1 to PD4. For example, a first transfer transistor TG1 corresponding to a first photodiode PD1, a second transfer transistor TG2 corresponding to a second photodiode PD2, a third transfer transistor TG3 corresponding to a third photodiode PD3, and a fourth transfer transistor TG4 corresponding to a fourth photodiode PD4 may share the floating diffusion region FD serving as a common drain region.

The sharing concept of the shared pixel SP may not only mean that the four photodiodes PD1 to PD4 share one floating diffusion region FD, but also mean that the four photodiodes PD1 to PD4 share pixel transistors RG, FS, and SEL excluding the transfer transistors TG1 to TG4. For example, the four photodiodes PD1 to PD4 included in the shared pixel SP may share a reset transistor RG, a source-follower transistor SF, and a selection transistor SEL. The reset transistor RG, the source-follower transistor SF, and the selection transistor SEL may be located in a second direction (y direction) in the transistor area PAt. In an implementation, the reset transistor RG, the source-follower transistor SF, and the selection transistor SEL may be located in a first direction (x direction) in the transistor area PAt according to a structure in which the photodiodes PD1 to PD4 and the transfer transistors TG1 to TG4 are arranged in the pixel shared area Pas.

Structures and operations of the reset transistor RG, the source-follower transistor SF, and the selection transistor SEL may be substantially the same as those of the reset transistor RG, the source-follower transistor SF, and the selection transistor SEL located in each of the pixels Px of the upper chip 100 of the image sensor 1000 shown in FIG. 2A except that the reset transistor RG, the source-follower transistor SF, and the selection transistor SEL are shared among the four photodiodes PD1 to PD4.

A connection relationship among the pixel transistors TG, RG, SF, and SEL will be briefly examined with reference to the circuit diagram of FIG. 5A. The four photodiodes PD1 to PD4 may constitute source regions of the four transfer transistors TG1 to TG4 corresponding respectively thereto. The floating diffusion region FD may constitute the common drain region of the transfer transistors TG1 to TG4 and be connected to the source region of the reset transistor RG by an interconnection 150. Also, the floating diffusion region FD may also be connected to a gate electrode of the source-follower transistor SF by the interconnection 150. A drain region may be shared between the reset transistor RG and the source-follower transistor SF and connected to a power supply voltage Vpix. A source region of the source-follower transistor SF and a drain region of the selection transistor SEL may be shared between the source-follower transistor SF and the selection transistor SEL. An output voltage Vout may be connected to a source region of the selection transistor SEL. For example, a voltage of the source region of the selection transistor SEL may be output as the output voltage Vout through a column line 110.

In the image sensor 1000a of the present embodiment, a unit shared pixel SP may include four pixels of the pixel shared area PAs and the transistors RG, SF, and SEL of the transistor area PAt corresponding to the pixel shared area Pas. The transfer transistors TG1 to TG4 corresponding to the number of the shared photodiodes PD1 to PD4 may be located in the pixel shared area PAs. Furthermore, in the image sensor 1000a of the present embodiment, column lines 110 may be disposed in a pixel area (refer to PA in FIG. 1B) and a peripheral area (refer PE in FIG. 1B) of the upper chip 100a and connected to source regions of selection transistors SEL of the shared pixels SP. While the column lines 110 are extending in the second direction (y direction), the column lines 110 may include the dummy column lines (refer to 110d in FIG. 1B) and have substantially the same length in the second direction (y direction). As a result, the image sensor 1000a of the present embodiment may uniformize a settling time and improve CFPN based on the column lines 110 having substantially the same length. Therefore, the image sensor 1000a of the present embodiment may provide improved images with minimized noise.

In an implementation, a unit shared pixel SP may include four pixels. In an implementation, in the image sensor 1000a of the present embodiment, the unit shared pixel SP may include two pixels or eight pixels.

Figure 6A:
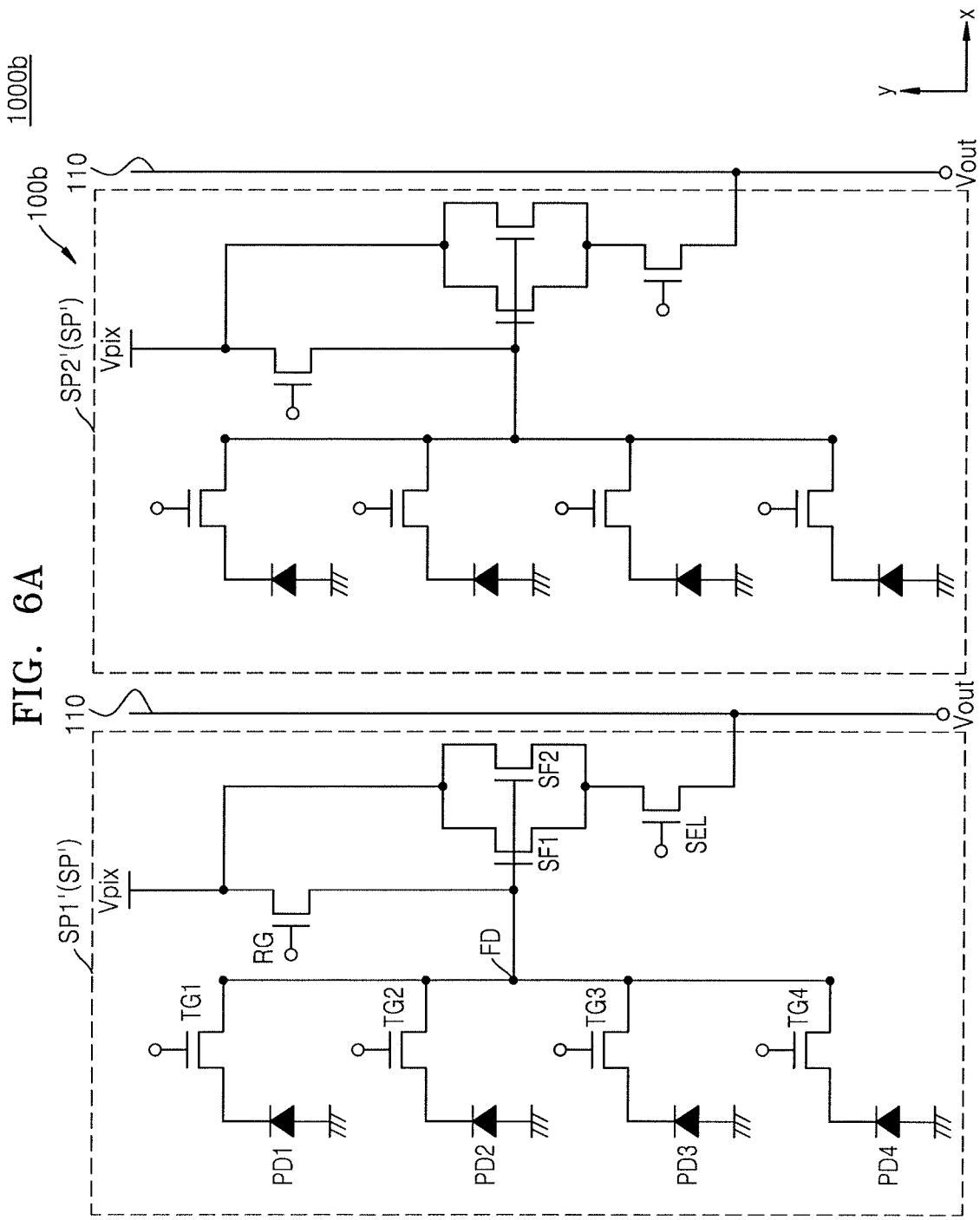
FIG. 6A illustrates a circuit diagram of shared pixels of an image sensor according to an embodiment.
Figure 6B:
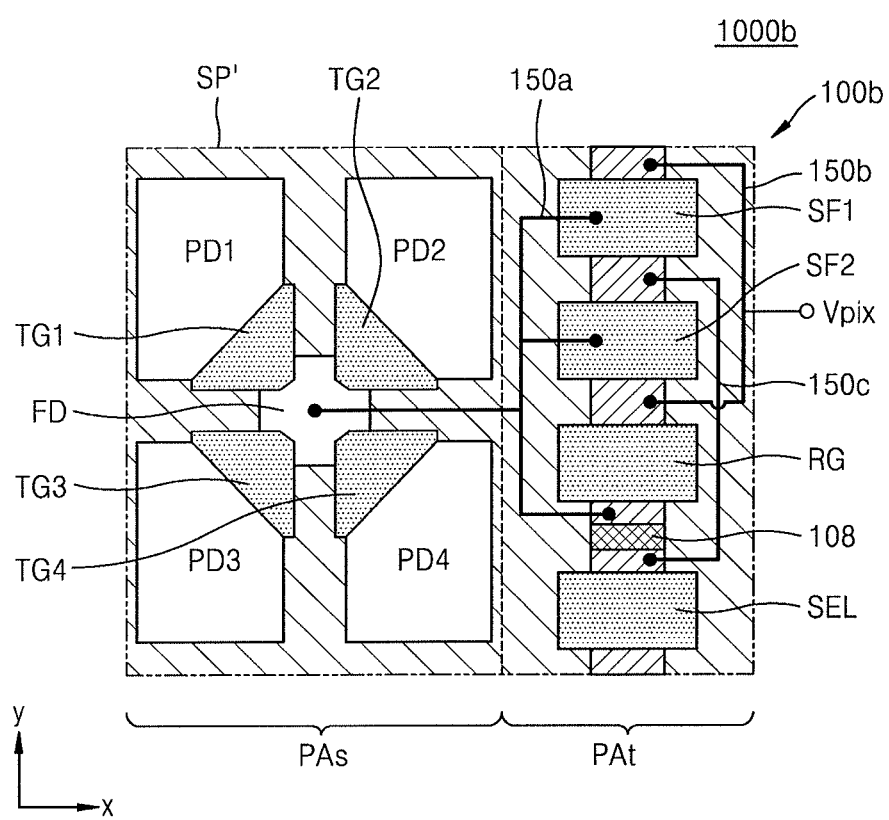
FIG. 6B illustrates a schematic plan view of one shared pixel in the circuit diagram of FIG. 6A.

FIG. 6A illustrates a circuit diagram of shared pixels SP of an image sensor 1000b according to an embodiment, and FIG. 6B illustrates a schematic plan view of one shared pixel SP in the circuit diagram of FIG. 6A.

Referring to FIGS. 6A and 6B, the image sensor 1000b of the present embodiment may differ from the image sensor 1000a of FIG. 5A in that each of shared pixels SP' of an upper chip 100b includes two source-follower transistors SF1 and SF2. For example, in the image sensor 1000b of the present embodiment, each of the shared pixels SP' may include a first source-follower transistor SF1 and a second source-follower transistor SF2, which are adjacent to each other. Also, in the image sensor 1000b of the present embodiment, the shared pixel SP' may include the two source-follower transistors SF1 and SF2, and a structure in which the pixel transistors RG, SF1, SF2, and SEL may be arranged may be different than in the image sensor 1000a of FIG. 5B.

For example, a connection relationship between the pixel transistors TG, RG, SF1, SF2, and SEL will be briefly examined with reference to the circuit diagram of FIG. 6A. A connection relationship among photodiodes PD1 to PD4, transfer transistors TG1 to TG4, and a floating diffusion region PD in a pixel shared area PAs may be substantially the same as in the circuit diagram of FIG. 5A. Meanwhile, the floating diffusion region PD may be connected to gate electrodes of a first source-follower transistor SF1 and a second source-follower transistor SF2 and a source region of a reset transistor RG through a first interconnection 150a.

A drain region may be shared between the second source-follower transistor SF2 and the reset transistor RG, connected to a drain region of the first source-follower transistor SF1 through a second interconnection 150b, and connected to a power supply voltage Vpix. A source region may be shared between the first source-follower transistor SF1 and the second source-follower transistor SF2 and connected to a drain region of a selection transistor SEL through a third interconnection 150c. An output voltage Vout may be connected to a source region of the selection transistor SEL. That is, a voltage of the source region of the selection transistor SEL may be output as the output voltage Vout through a column line 110.

FIG. 5B illustrates a case in which the reset transistor RG and the selection transistor SEL are respectively located on both sides of the source-follower transistor SF. In the image sensor 1000b of the present embodiment, as can be seen from FIG. 6B, the reset transistor RG and the selection transistor SEL may be arranged on one side of the first and second source-follower transistors SF1 and SF2. The arrangement of the reset transistor RG and the selection transistor SEL may be a result of sharing the source and drain regions between the two source-follower transistors SF1 and SF2. For example, when odd source-follower transistors are located, a reset transistor and a selection transistor may be respectively located on both sides of the source-follower transistors. When even source-follower transistors are located, a reset transistor and a selection transistor may be located on one side of the source-follower transistors. Also, as may be seen from FIG. 6B, when the reset transistor RG and the selection transistor SEL are located on one side of the first and second source-follower transistors SF1 and SF2, a device isolation film 108 may be located between the reset transistor RG and the selection transistor SEL.

In the image sensor 1000b of the present embodiment, column lines 110 may be located in a pixel area (refer to PA in FIG. 1B) and a peripheral area (refer to PE in FIG. 1B) of the upper chip 100b and connected to the source regions of the selection transistors SEL of the shared pixels SP'. While the column lines 110 are extending in the second direction (y direction), the column lines 110 may include the dummy column lines (refer to 110d in FIG. 1B) and have substantially the same length in the second direction. As a result, in the image sensor 1000b of the present embodiment, a settling time may be uniformized and CFPN may be improved based on the column lines 110 having substantially the same length. Accordingly, the image sensor 1000b of the present embodiment may provide improved images of which noise is minimized.

Figure 7A:
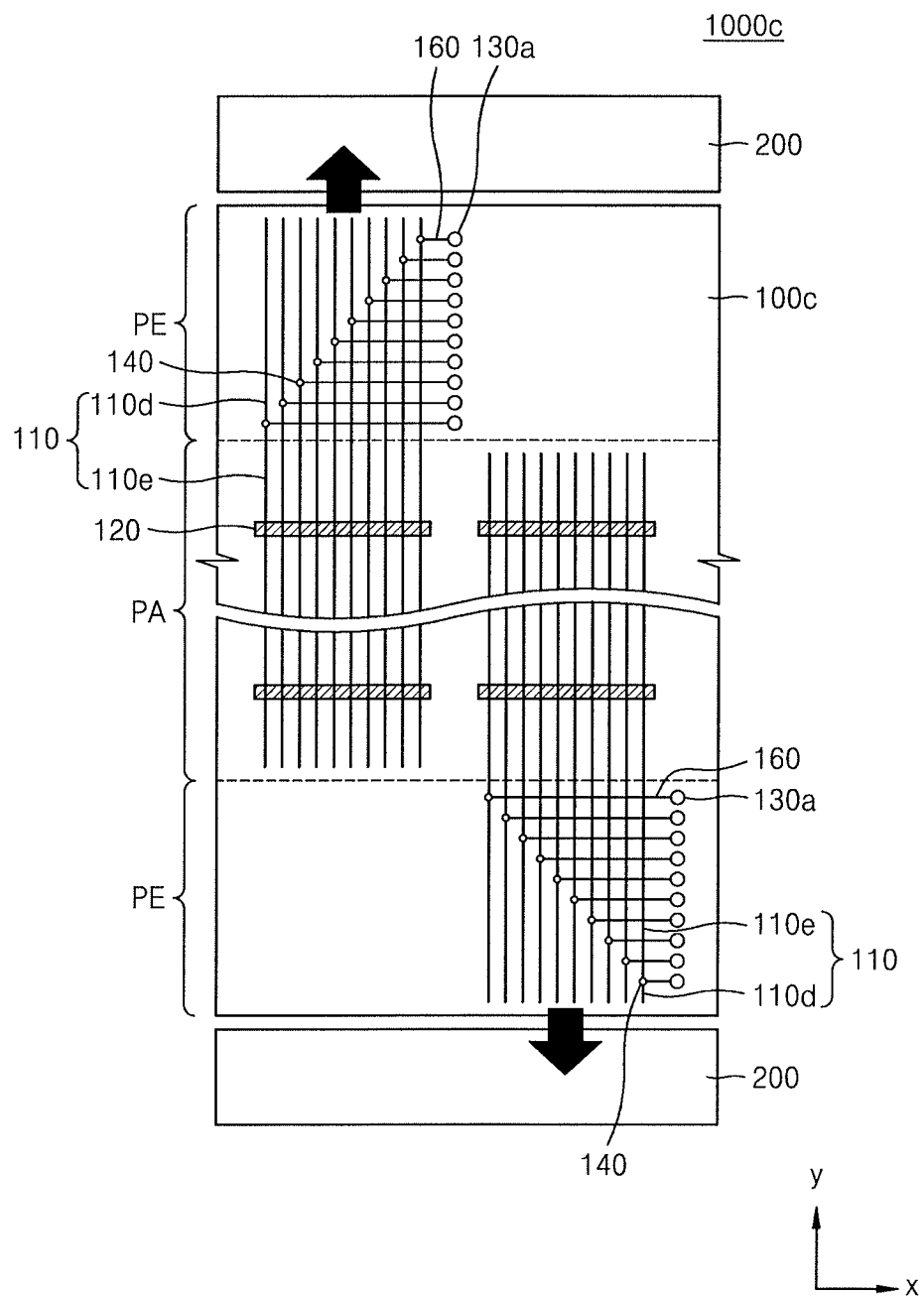
FIGS. 7A, 8A, and 9A illustrate conceptual diagrams of structures of column lines of pixel areas in image sensors according to embodiments.
Figure 7B:
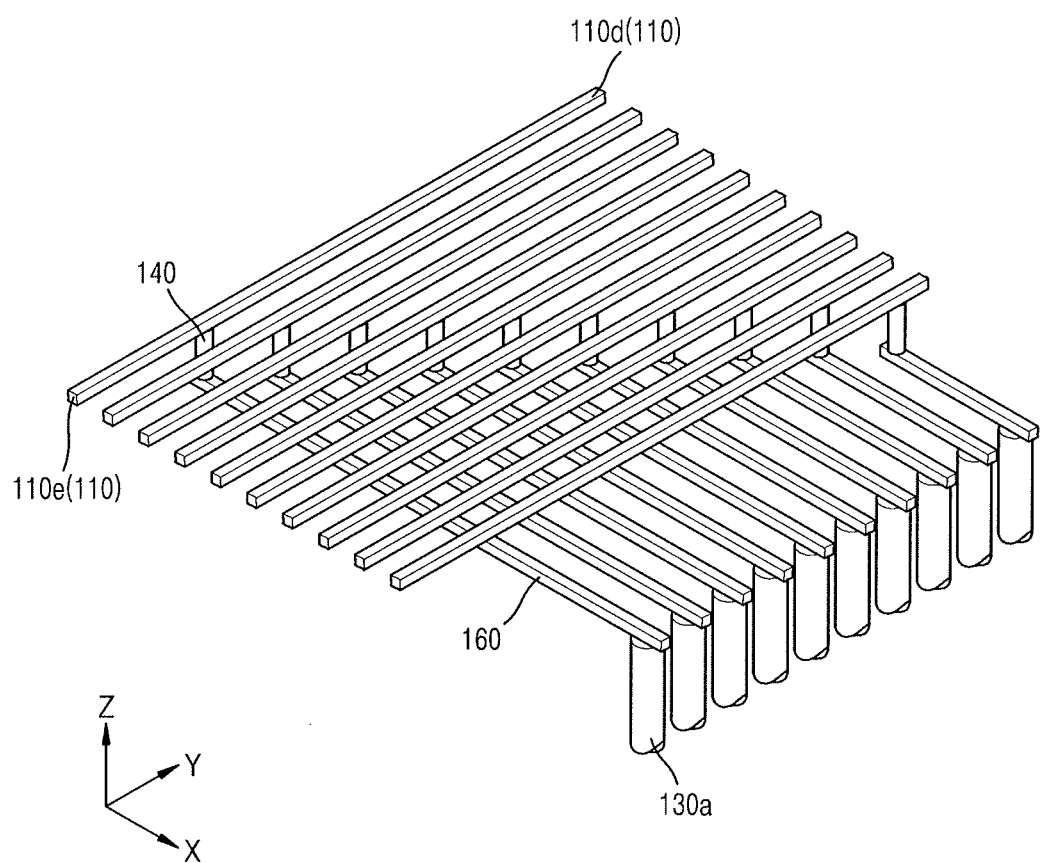
FIGS. 7B, 8B, and 9B illustrate perspective views of connection portions between the structures of the column lines of FIGS. 7A, 8A, and 9A and through vias, respectively.
Figure 8A:
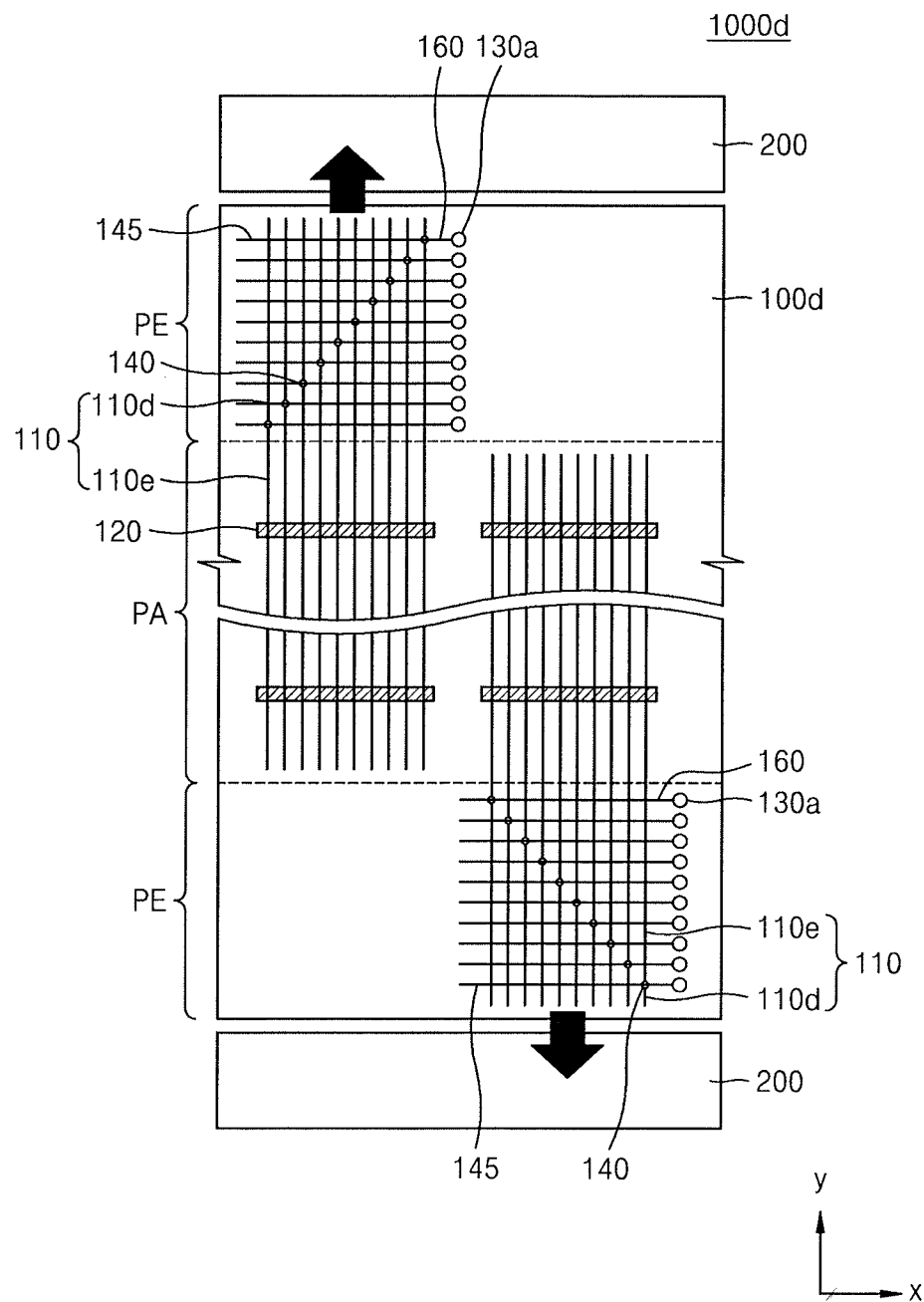
Figure 8B:
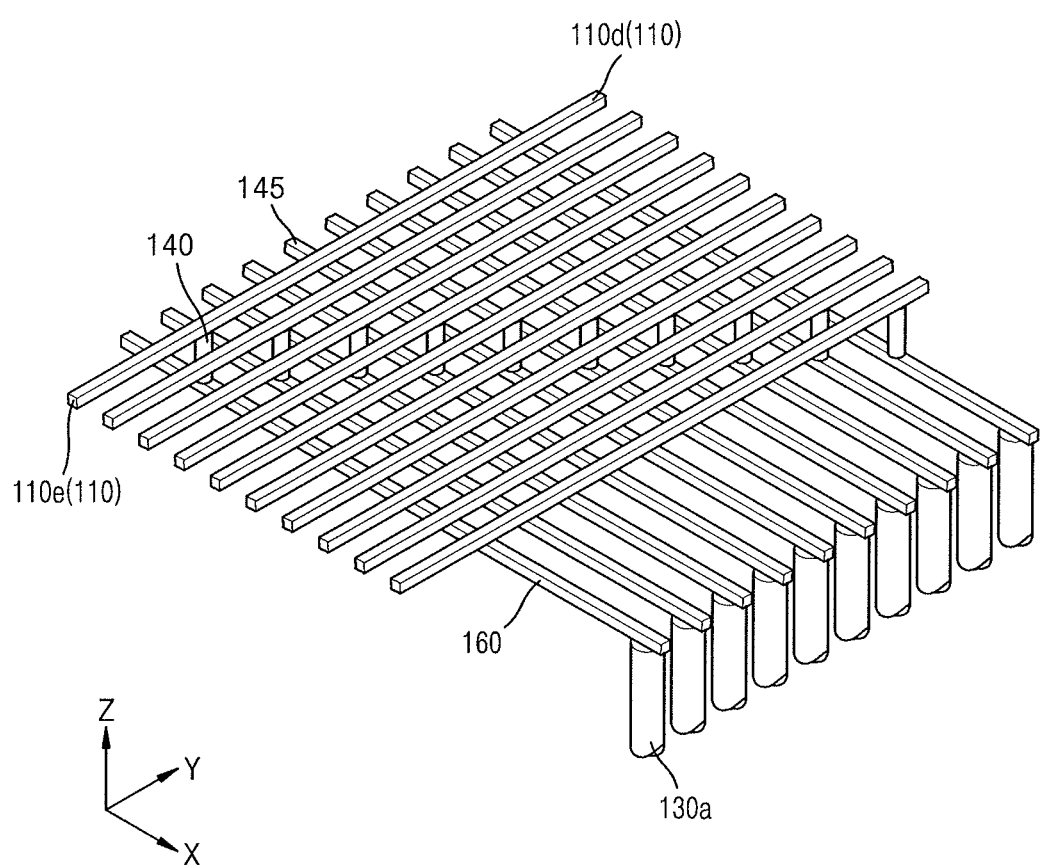
Figure 9A:
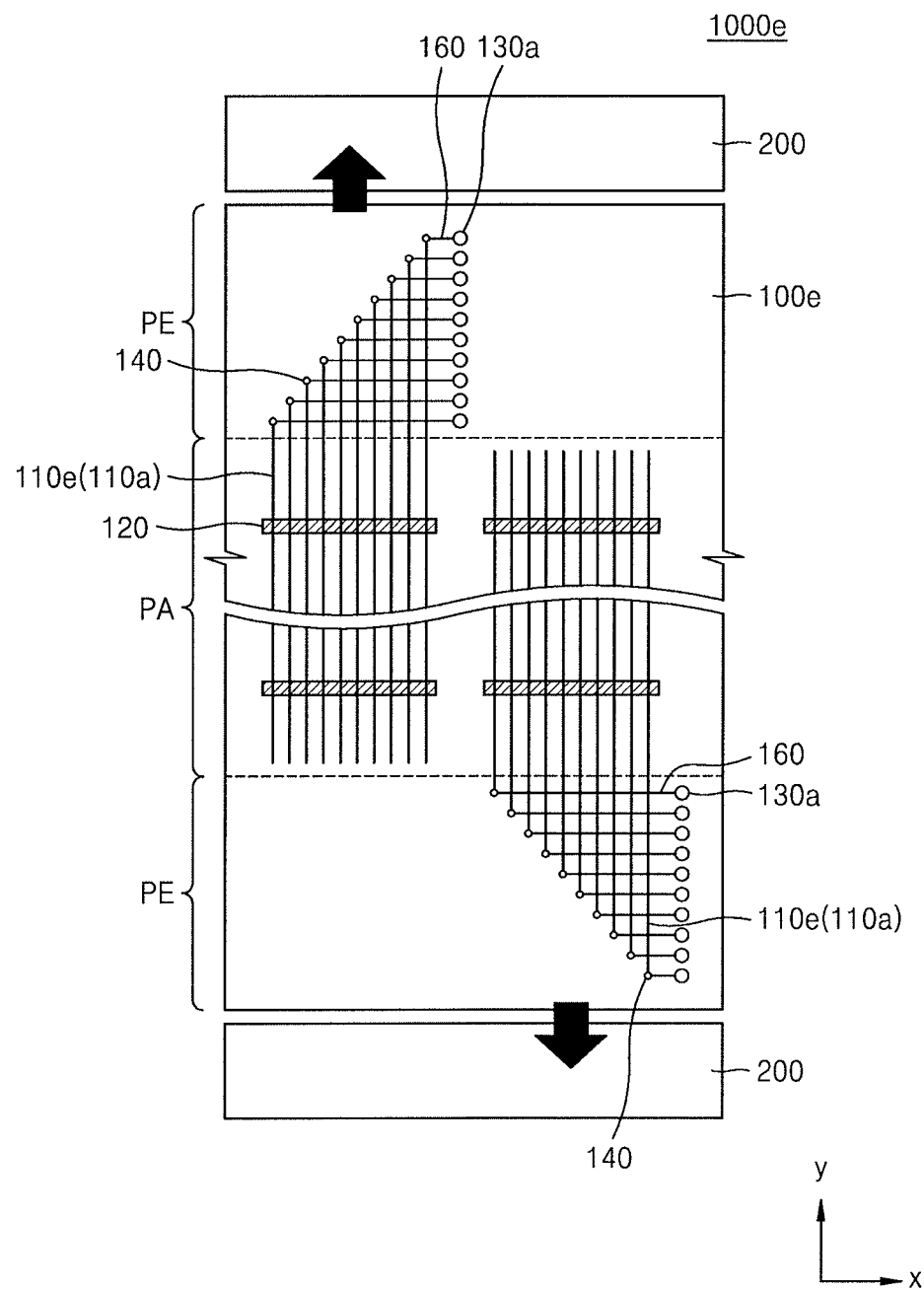
Figure 9B:
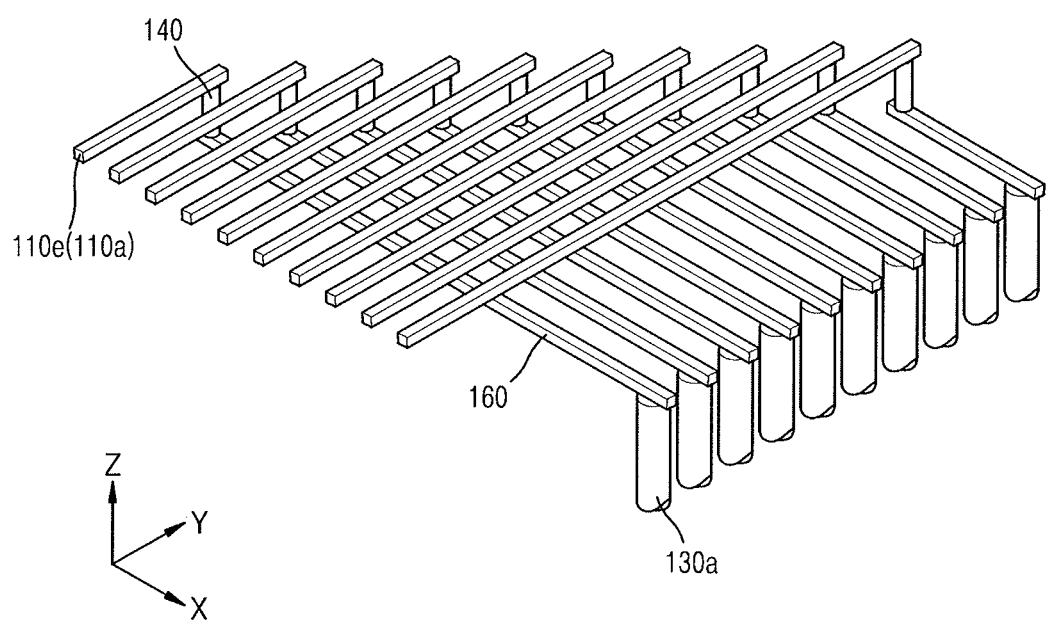

FIGS. 7A, 8A, and 9A illustrate conceptual diagrams of structures of column lines of pixel areas in image sensors according to embodiments. FIGS. 7B, 8B, and 9B illustrate perspective views of connection portions between the column lines and the through vias in the structures of the column lines of FIGS. 7A, 8A, and 9A, respectively. The same descriptions as in FIGS. 1B, 3A, and 3B will be simplified or omitted.

Referring to FIGS. 7A and 7B, an image sensor 1000c of the present embodiment may differ from the image sensor 1000 of FIG. 1B in that vertical contacts 140 and middle interconnections 160 may be further provided in a peripheral area PE of an upper chip 100c. Also, in the image sensor 1000c of the present embodiment, positions of through vias 130a may differ from positions of the through vias 130 of the image sensor 1000 of FIG. 1B. For example, in the image sensor 1000c of the present embodiment, the vertical contacts 140 may be located in the peripheral area PE of the upper chip 100c along a first direction (x direction) to be away from the pixel area PA in the second direction (y direction), and the column lines 110 may be connected to the vertical contacts 140. As in the image sensor 1000 of FIG. 1B, each of the column lines 110 may include an effective column line 110e and a dummy column line 110d. For example, the vertical contacts 140 may be located in substantially the same positions as the through vias 130 of the image sensor 1000 of FIG. 1B. The vertical contacts 140 may function to connect the column lines 110 with the middle interconnections 160, and the vertical contacts 140 may be smaller in size (e.g., diameter or width) than the through vias 130.

The middle interconnections 160 may be connected to the vertical contacts 140 and may extend (e.g., lengthwise) in the first direction (x direction). The middle interconnections 160 may be located in a layer disposed directly under a layer in which the column lines 110 are arranged. In an implementation, the middle interconnections 160 may be located, e.g., in a layer disposed directly on a layer in which the column lines 110 are arranged.

The through vias 130a may be arranged in a line along the second direction (y direction) and may extend in a third direction (z direction). The through vias 130a may be connected to the middle interconnections 160. FIGS. 7A and 7B illustrate a case in which the middle interconnections 160 are connected to ends of the through vias 30a. In an implementation, the through vias 130a may further extend upwardly in the third direction (z direction), and the middle interconnections 160 may be connected to side surfaces of the through vias 130a.

Referring to FIGS. 8A and 8B, an image sensor 1000d of the present embodiment may be almost similar to the image sensor 1000c of FIG. 7A in that vertical contacts 140 and middle interconnections 160 may be further provided in a peripheral area PE of an upper chip 100d and through vias 130a are arranged in a line in a second direction (y direction). In the image sensor 1000d of the present embodiment, additional dummy lines 145 may be further located in the peripheral area PE of the upper chip 100d. The additional dummy lines 145 may be connected to the middle interconnections 160 and extend beyond the vertical contacts 140 in the first direction (x direction, e.g., away from the through vias 130a). The additional dummy lines 145 may serve functions similar to the above-described dummy column lines 110d of the column lines 110.

Referring to FIGS. 9A and 9B, an image sensor 1000e of the present embodiment may be almost similar to the image sensor 1000c of FIG. 7A in that vertical contacts 140 and a middle interconnection 160 may be further provided in a peripheral area PE of an upper chip 100e and through vias 130a are arranged in a line in a second direction (y direction). The image sensor 1000e of the present embodiment, column lines 110a may not include dummy column lines. As shown in FIGS. 9A and 9B, the column lines 110a may be connected to the through vias 130a through the vertical contacts 140 and the middle interconnections 160. Also, long middle interconnections 160 may be connected to short column lines 110a, and short middle interconnections 160 may be connected to long column lines 110a. Accordingly, when the middle interconnections 160 are included as parts in the column lines 110a, the overall lengths of the column lines 110a may be substantially the same based on positions of the through vias 130a.

In an implementation, even if the column lines 110a include the middle interconnections 160, in case that the overall lengths of the column lines 110a are not the same, at least some of the column lines 110a may include dummy column lines so that the overall lengths of the column lines 110a may be substantially the same. Also, additional dummy lines connected to the middle interconnections 160 may be located instead of the dummy column lines so that the overall lengths of the column lines 110 may be substantially the same.

Figure 10:
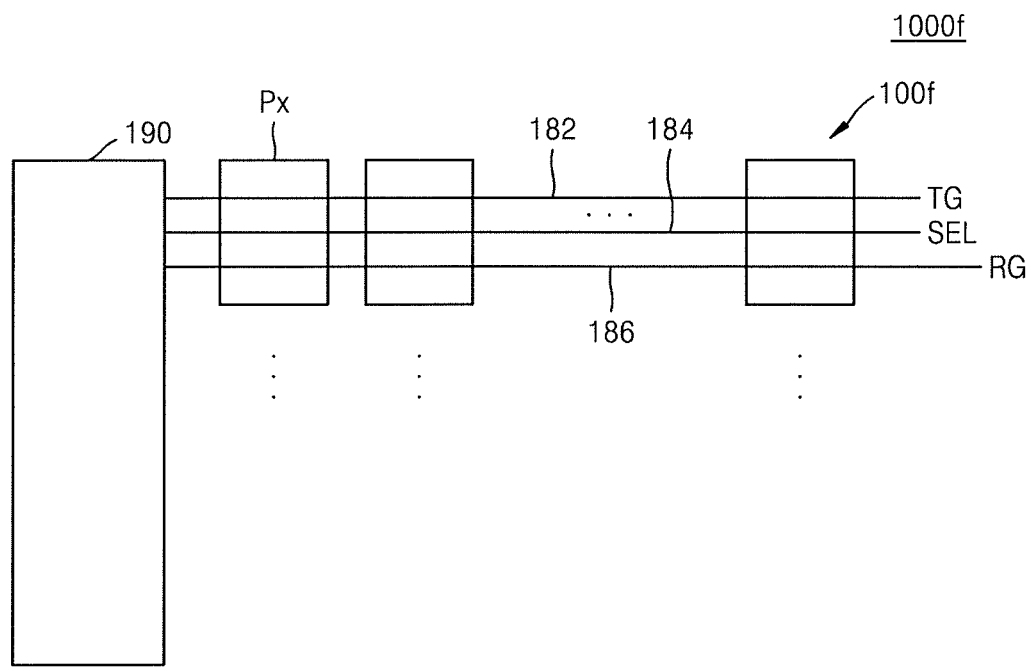
FIGS. 10 and 11 illustrate conceptual diagrams of structures of row lines of pixel areas in image sensors according to embodiments.
Figure 11:
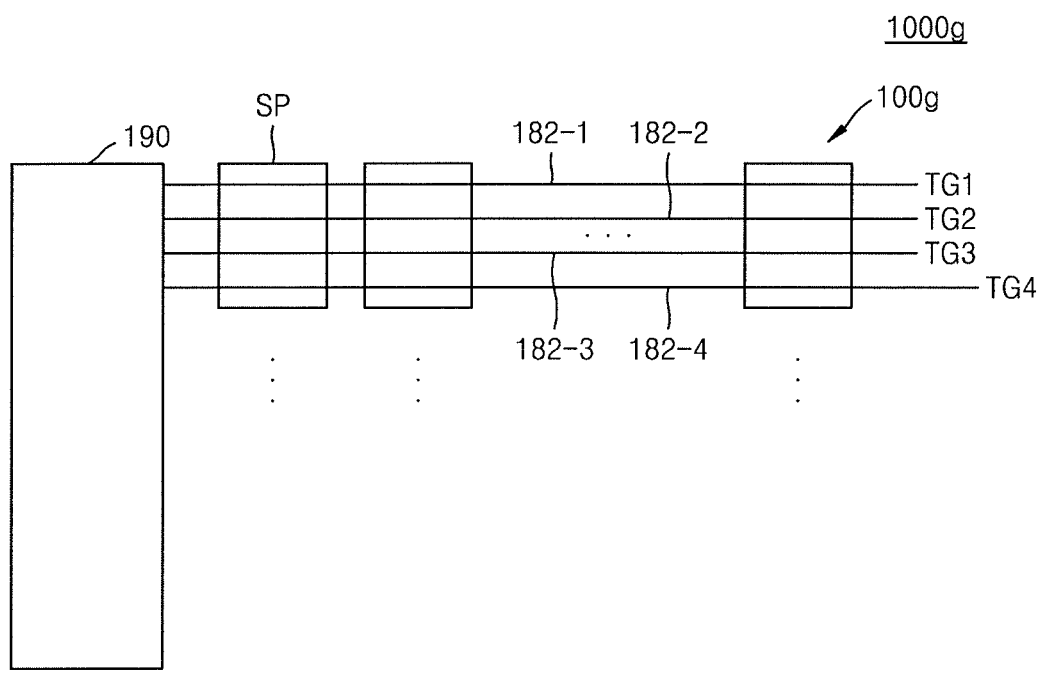

FIGS. 10 and 11 illustrate conceptual diagrams of structures of row lines of pixel areas in image sensors according to embodiments.

Referring to FIG. 10, in an image sensor 1000f of the present embodiment, a plurality of row lines may be located in a pixel area (refer to PA in FIG. 1B) of an upper chip 100f. The row lines may include, e.g., a transfer transistor line 182 connected to a gate electrode of a transfer transistor (refer to TG in FIG. 2A), a selection transistor line 184 connected to a gate electrode of a selection transistor (refer to SEL in FIG. 2A), and/or a reset transistor line 186 connected to a gate electrode of a reset transistor (refer to RG in FIG. 2A). The row lines may be connected to a row drive circuit 190, and a signal corresponding to an appropriate voltage may be applied from the row drive circuit 190 to the transfer transistor TG, the selection transistor SEL, and the reset transistor RG. The row drive circuit 190 may be included in typical logic devices and located in a lower chip (refer to 200 in FIG. 1A). In an implementation, the row drive circuit 190 may be located in an upper chip (refer to 100 in FIG. 1A).

Meanwhile, capacitances of the transistors TG, SETL and RG included in the pixels Px may be different. Thus, even if the row lines have the same length in a first direction (x direction), differences in RC delay may occur so that the row lines may have respectively different characteristics of transmission of signals to the pixels Px. In the image sensor 1000f of the present embodiment, the characteristics of transmission of signals to the pixels Px may be uniformized by adjusting lengths of some of the row lines. For example, when the reset transistor RG has a low capacitance and a signal transmission rate of the reset transistor line 186 is higher than signal transmission rates of the transfer transistor line 182 and the selection transistor line 184, signal transmission characteristics may be uniformized by adjusting the reset transistor line 186 to a length greater than lengths of the transfer transistor line 182 and the selection transistor line 184.

Referring to FIG. 11, in an image sensor 1000g of the present embodiment, shared pixels (refer to SP in FIG. 5A) may be located in a pixel area (refer to PA in FIG. 1B) of an upper chip 100g. Also, a plurality of row lines may be located in the pixel area of the upper chip 100g. First to fourth transfer transistor lines 182-1, 182-2, 182-3, and 182-4 may be located in the row lines and connected to four transfer transistors (refer to TG1 to TG4 in FIG. 5A) arranged in the shared pixels. For reference, a selection transistor line (refer to 184 in FIG. 10) and a reset transistor line (refer to 186 in FIG. 10) are omitted from FIG. 11.

Meanwhile, capacitances of the transfer transistors located in the shared pixels SP may different. Thus, even if the transfer transistor lines 182-1, 182-2, 182-3, and 182-4 have the same length in a first direction (x direction), differences in RC delay may occur so that the transfer transistor lines 182-1, 182-2, 182-3, and 182-4 may have respectively different characteristics of transmission of signals to the pixels in the shared pixels SP. In the image sensor 1000g of the present embodiment, the characteristics of transmission of the signals to the pixels in the shared pixels SP may be uniformized by adjusting lengths of some of the transfer transistor lines 182-1, 182-2, 182-3, and 182-4. For example, when the fourth transfer transistor has a low capacitance and a signal transmission rate of the fourth transfer transistor line 182-4 is higher than signal transmission rates of the other transfer transistor lines 182-1, 182-2, and 182-3, signal transmission characteristics may be uniformized by adjusting the fourth transfer transistor line 182-4 to a length greater than lengths of the other transfer transistor lines 182-1, 182-2, and 182-3.

Figure 12A:
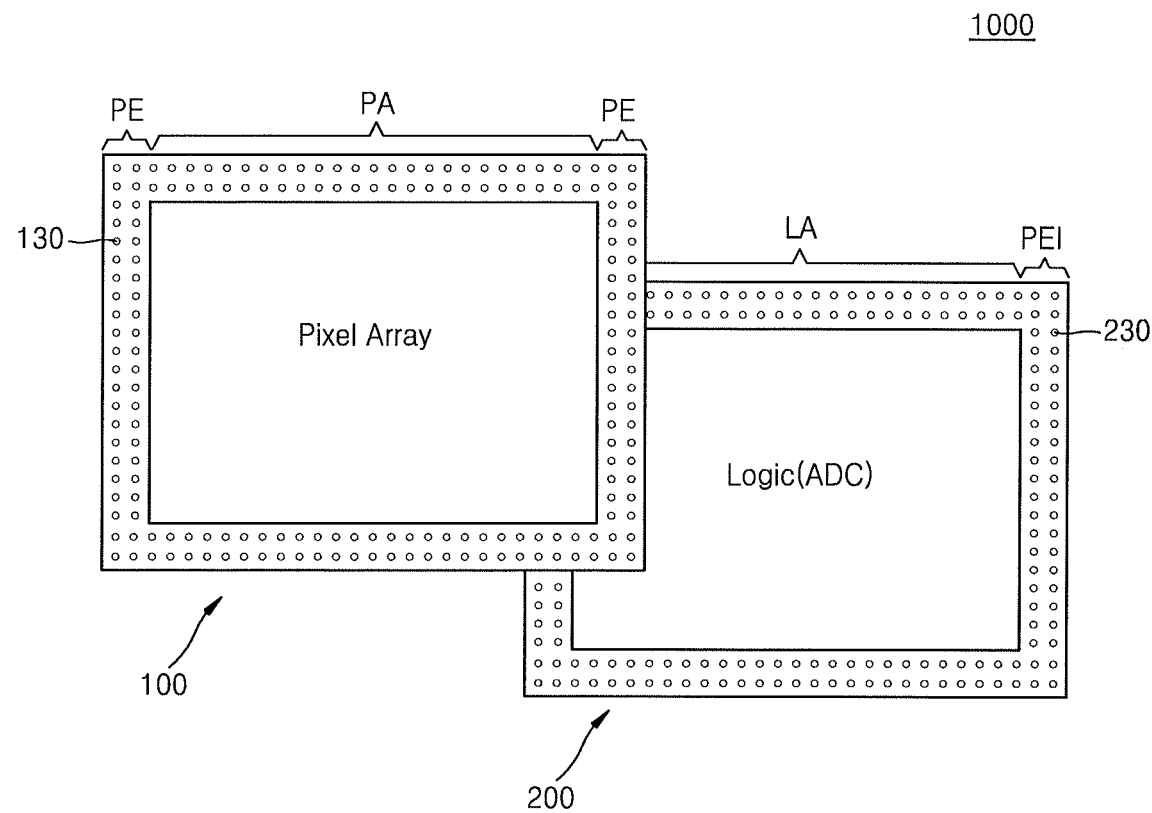
FIGS. 12A and 12B respectively illustrate a plan view and a cross-sectional view of an image sensor according to an embodiment, in which an upper chip is combined with a lower chip by using through-silicon vias (TSVs)
Figure 12B:
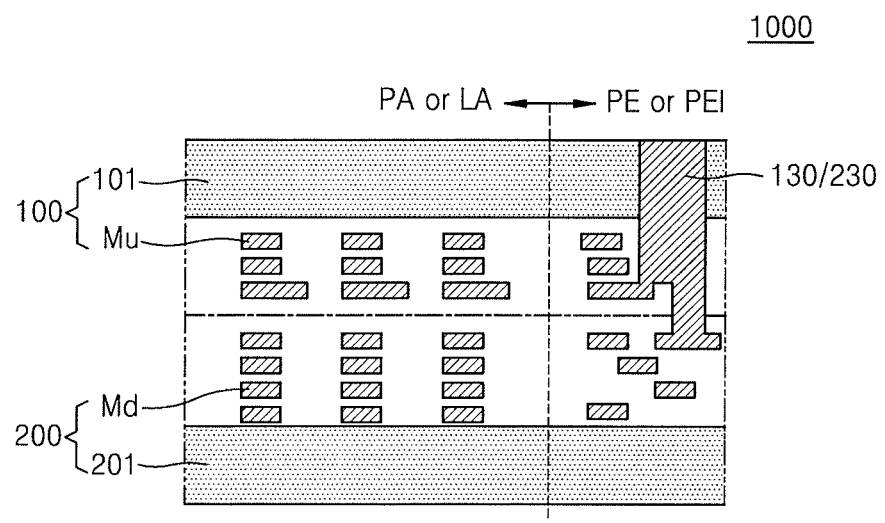

FIGS. 12A and 12B respectively illustrate a plan view and a cross-sectional view of the image sensor 1000 of FIG. 1A in which an upper chip 100 is combined with a lower chip 200 by using through vias. FIGS. 12A and 12B will be described with further reference to FIGS. 1A and 1B, and the same descriptions as in FIGS. 1A and 1B may be simplified or omitted.

Referring to FIGS. 12A and 12B, in the image sensor 1000 of the present embodiment, the upper chip 100 may include first through vias 130, and the lower chip 200 may include second through vias 230. As shown in FIG. 12B, the upper chip 100 may be electrically connected to the lower chip 200 by the first and second through vias 130 and 230.

For example, the upper chip 100 may include a pixel area PA and a peripheral area PE located outside the pixel area PA. Pixels may be arranged in a 2D array in the pixel area PA, and a plurality of first through vias 130 may be arranged in the peripheral area PE. As shown in FIG. 12B, a semiconductor substrate 101 may be located in an upper portion of the upper chip 100, and pixels may be formed in the semiconductor substrate 101. Also, color filters and microlenses may be formed in an upper portion of the semiconductor substrate 101. Interconnection layers Mu may be located in a lower portion of the upper chip 100.

As described above, a structure in which the color filters and the microlenses are formed in an opposite direction to the interconnection layers Mu on the basis of the semiconductor substrate 101 in which the pixels are formed may be referred to as a back-side illumination (BSI) structure. Conversely, a structure in which the color filters and the microlenses are formed in the same direction as the interconnection layers Mu on the basis of the semiconductor substrate 101, e.g., a structure in which the color filters and the microlenses are formed on the interconnection layers Mu, may be referred to as a front-side illumination (FSI) structure.

In an implementation, the first through vias 130 may be arranged in outer portions of all four sides of the upper chip 100. In an implementation, the first through vias 130 may not be formed in the outer portion of at least one of the four sides of the upper chip 100. Each of the first through vias 130 may be configured to wholly or partially penetrate the upper chip 100. The first through vias 130 may be electrically connected to the interconnection layers Mu located in the peripheral area PE of the upper chip 100.

The lower chip 200 may include a logic area LA and a peripheral area PEI located outside the logic area LA. Logic devices including an ADC circuit may be located in the logic area LA, and a plurality of second through vias 230 may be located in the peripheral area PEI. As shown in FIG. 12B, a semiconductor substrate 201 may be located in a lower portion of the lower chip 200, and interconnection layers Md may be located in an upper portion of the lower chip 200. Transistors of the logic devices may be formed in the semiconductor substrate 201.

Unlike the first through vias 130, the second through vias 230 may be formed in only a portion of the upper portion of the lower chip 200 and electrically connected to the interconnection layer Md located in the peripheral area PEI of the lower chip 200. Also, the first through vias 130 may be integrally connected to the second through vias 230 so that the upper chip 100 may be electrically connected to the lower chip 200 through the first through vias 130 and the second through vias 230.

Meanwhile, a distinction between the first through via 130 and the second through via 230 may be only a convenient distinction as to whether the first through via 130 or the second through via 230 is located in the upper chip 100 or the lower chip 200. For example, the first through via 130 and the second through via 230 may have an inseparable, integral structure due to the fact that the first through via 130 and the second through via 230 are not separately formed in the upper chip 100 and the lower chip 200, respectively, but formed as one through via in the upper and lower chips 100 and 200 by using a through-via forming process after the upper chip 100 is combined with the lower chip 200. In FIG. 12B, an alternated long and short dash line denotes a boundary along which the upper chip 100 is combined with the lower chip 200. The upper chip 100 and the lower chip 200 may be stacked and combined on a wafer level and then separated in units of stack chips. In an implementation, the stacking and combination of the upper and lower chips 100 and 200 on a chip level may not be entirely excluded.

In the image sensor 1000 of the present embodiment, the upper chip 100 may be electrically connected to the lower chip 200 through the first and second through vias 130 and 230, and the upper chip 100 may have a BSI structure, so that the first and second through vias 130 and 230 may be formed in the outer portions of the upper and lower chips 100 and 200. Since the first through vias 130 are configured to penetrate the upper chip 100, when the first through vias 130 are located in a pixel area PA, an area occupied by the pixels may be reduced, thereby precluding the implementation of a high-resolution image sensor. As described above with reference to FIG. 1B, in the image sensor 1000 of the present embodiment, while column lines 110 are extending in a second direction (y direction), the column lines 110 may include dummy column lines 110d and may have substantially the same length in the second direction (y direction). Accordingly, the image sensor 1000 of the present embodiment may uniformize a settling time and improve CFPN based on the column lines 110 having substantially the same length. Therefore, the image sensor 1000 of the present embodiment may provide improved images with minimized noise.

Figure 13:
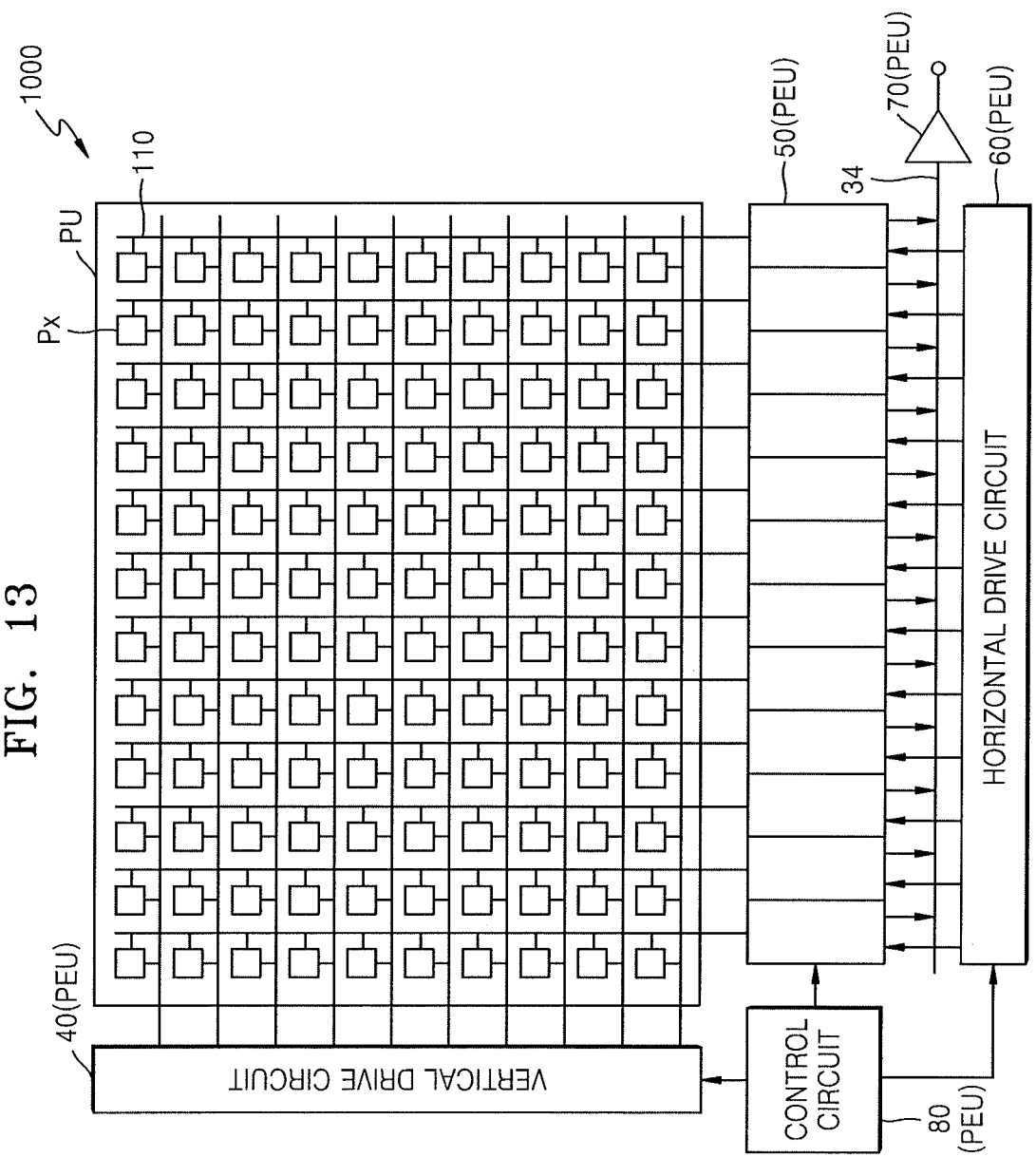
FIG. 13 illustrates a schematic construction diagram of an image sensor according to an embodiment.

FIG. 13 illustrates a schematic construction diagram of the image sensor 1000 of FIG. 1A. FIG. 13 will be described with further reference to FIGS. 1A and 1B, and the same descriptions as in FIGS. 1A and 1B will be simplified or omitted.

Referring to FIG. 13, the image sensor 1000 of the present embodiment may include a pixel unit PU and a peripheral circuit unit PEU. A plurality of pixels Px may be regularly arranged in a 2D array in the pixel unit PU. In an implementation, the pixels Px may be the pixels Px formed on the upper chip 100 of the image sensor 1000 of FIG. 2A. In an implementation, the pixels Px may be shared pixels SP formed on the upper chip 100a of the image sensor 1000a of FIG. 5A. The pixel unit PU may be formed on the upper chip 100 and include a pixel area and a peripheral area.

The peripheral circuit unit PEU may be located adjacent to the pixel unit PU and include a vertical drive circuit 40, a clock signal processing circuit 50, a horizontal drive circuit 60, an output circuit 70, and a control circuit 80. The peripheral circuit unit PEU may be formed in a lower chip 200. However, in some embodiments, the peripheral circuit unit PEU may be partially or wholly formed in the upper chip 100.

The control circuit 80 may control the vertical drive circuit 40, the clock signal processing circuit 50, and the horizontal drive circuit 60. For example, the control circuit 80 may generate clock signals or control signals, which serve as bases for operations of the vertical drive circuit 40, the clock signal processing circuit 50, and the horizontal drive circuit 60, based on a vertical synchronous signal, a horizontal synchronous signal, and a master clock. Also, the control circuit 80 may input clock signals or control signals to the vertical drive circuit 40, the clock signal processing circuit 50, and the horizontal drive circuit 60.

The vertical drive circuit 40 may include, e.g., a shifter register. The vertical drive circuit 40 may select a pixel drive interconnection, supply a pulse for driving pixels to the selected pixel drive interconnection, and drive pixels in rows. For example, the vertical drive circuit 40 may sequentially selectively scan pulse to the pixels Px of the pixel unit PU in rows in a vertical direction. Also, the vertical drive circuit 40 may supply pixel signals corresponding to charges generated by photodiodes of the pixels Px to the clock signal processing circuit 50 through column lines 110.

The clock signal processing circuit 50 may be located in each of columns of the pixels Px and perform a signal processing operation (e.g., noise removal) on signals output by the pixels Px in each of the columns of the pixels Px. For example, the clock signal processing circuit 50 may perform a signal processing operation, such as a correlated-double sampling (CDS) operation for removing noise of the pixels Px, a signal amplification operation, and an ADC operation. A horizontal selection switch may be installed at an output terminal of the clock signal processing circuit 50.

The horizontal drive circuit 60 may include, e.g., a shift register. The horizontal drive circuit 60 may sequentially horizontal scan pulses, sequentially select the respective clock signal processing circuits 50, and output pixel signals of the respective clock signal processing circuits 50 to a horizontal signal line 34. The output circuit 70 may process signals sequentially supplied from the respective clock signal processing circuits 50 through the horizontal signal line 34, and output the processed signals. For example, the output circuit 70 may only buffer the signals or perform black level adjustment, thermal non-uniformity correction, or various digital signal processing operations on the signals.

Figure 14:
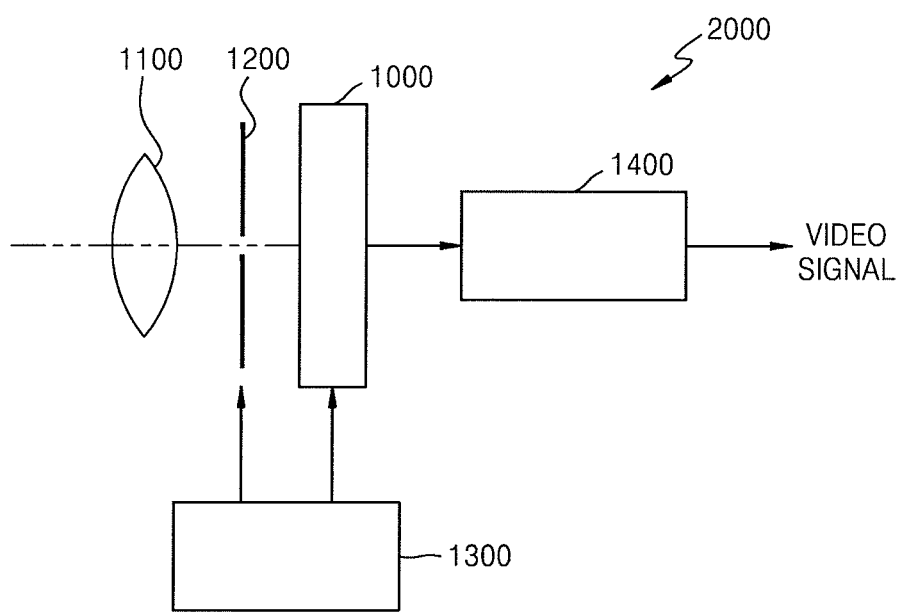
FIG. 14 illustrates a schematic construction diagram of an electronic apparatus including an image sensor according to an embodiment.

FIG. 14 illustrates a schematic construction diagram of an electronic apparatus 2000 including an image sensor 1000 according to an embodiment.

Referring to FIG. 14, the electronic apparatus 2000 of the present embodiment may include an image sensor 1000, an optical system 1100, a shutter 1200, a drive circuit 1300, and a signal processing circuit 1400. The electronic apparatus 2000 of the present embodiment may be, for example, a CMOS camera capable of capturing still images or moving images.

The image sensor 1000 may be at least one of the image sensors 1000 and 1000a to 1000g of FIGS. 1A to 3B and 5A to 11. the image sensor 1000 may include a pixel unit PU and a peripheral circuit unit PEU as shown in FIG. 13 or have a stack structure of the upper chip 100 and the lower chip 200 as shown in FIG. 1A.

The optical system 1100 may be an element configured to guide incident light to a light receiving unit of the image sensor 1000 and include a plurality of optical lenses. For example, the optical system 1100 may image incident light from a subject on an imaging surface of the image sensor 1000 so that charges may be generated and accumulated in the image sensor 1000.

The shutter 1200 may control periods for which light is irradiated to or shielded from the image sensor 1000. The drive circuit 1300 may supply drive signals to control a transfer operation of the image sensor 1000 and an operation of the shutter 1200. The image sensor 1000 may transmit signals in response to a drive signal (or a timing signal) supplied from the drive circuit 1300.

The signal processing circuit 1400 may perform various signal processing operations on output signals of the image sensor 1000. Video signals processed by the signal processing circuit 1400 may be stored in a storage medium (e.g., a memory) or output to a monitor.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

By way of summation and review, with a reduction in pixel size, an image sensor with a shared pixel structure may be used, and a high-performance image sensor capable of capturing images at high speed may be considered.

The embodiments may provide an image sensor capable of minimizing noise and providing improved images.

The embodiments may provide an image sensor, which may help uniformize signal transmission characteristics and minimize noise caused thereby to provide improved images.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
  a plurality of pixels, each pixel of the plurality of pixels including a photodiode, which is coupled to a transfer transistor, which is coupled to a reset transistor, which is coupled to a source-follower transistor, which is coupled to a selection transistor;
  a plurality of first interconnection lines connected to a gate of the transfer transistor, a gate of the reset transistor, and a gate of the selection transistor, the plurality of first interconnection lines extending in a first direction; and
  a plurality of second interconnection lines connected to a source region of the selection transistor, the plurality of second interconnection lines extending in a second direction that intersects the first direction, wherein the plurality of second interconnection lines includes dummy lines on a peripheral area that is outside of a pixel area in which the pixels are located.

2. The image sensor as claimed in claim 1, wherein:
the plurality of second interconnection lines have a same length in the second direction.

3. The image sensor as claimed in claimed in claim 1, wherein:
the plurality of second interconnection lines have a same capacitance.

4. The image sensor as claimed in claim 1, wherein:
at least one first interconnection line of the plurality of first interconnection lines has a length that is different from a length of remaining first interconnection lines of the plurality of first interconnection lines.

5. The image sensor as claimed in claim 1, further comprising:
a first semiconductor chip that includes the pixel area and the peripheral area; and
a second semiconductor chip under the first semiconductor chip, the second semiconductor chip including logic devices configured to process signals,
wherein:
the plurality of first interconnection lines are row lines, and
the plurality of second interconnection lines are column lines.

6. The image sensor as claimed in claim 5, wherein:
through vias connected to the plurality of second interconnection lines are located in the peripheral area, the through vias being arranged along the first direction to be periodically farther away from the pixel area in the second direction,
the plurality of second interconnection lines are alternately connected to one of the through vias located on an upper side of the second direction and another of the through vias located on a lower side of the second direction, the plurality of second interconnection lines including effective lines from the pixel area to the through vias, and
the dummy lines are connected to the effective lines and extend beyond the through vias in the second direction.

7. The image sensor as claimed in claim 6, wherein:
every n through vias form a group along the first direction, n being a natural number equal to or greater than 2,
a first through via of the through vias included in any one group is located closest to the pixel area, and an n-th through via of the through vias included in the any one group is located farthest from the pixel area,
one of the dummy lines corresponding to the first through via extends a longest length, and
no dummy line corresponding to the n-th through via exists or a dummy line corresponding to the n-th through via extends a shortest length.

8. The image sensor as claimed in claim 5, wherein:
vertical contacts, middle interconnections, and through vias are in the peripheral area, the vertical contacts being connected to the plurality of second interconnection lines, the middle interconnections being at a different layer from the plurality of second interconnection lines and connected to the vertical contacts, the middle interconnections extending in the first direction, the through vias being connected to the middle interconnections and arranged in a line in the second direction,
the vertical contacts are arranged along the first direction to be periodically farther away from the pixel areas in the second direction,
the plurality of second interconnection lines are alternately connected to a vertical contact located on an upper side of the second direction and a vertical contact of a lower side of the second direction, the plurality of second interconnection lines including effective lines from the pixel area to the vertical contact, and
the dummy lines are connected to the effective lines and extend beyond the vertical contacts in the second direction.

9. The image sensor as claimed in claim 8, wherein:
every n vertical contacts repetitively form groups along the first direction, n being a natural number equal to or greater than 2,
a first vertical contact of the vertical contacts included in any one group is located closest to the pixel area, and an n-th vertical contact of the vertical contacts included in the any one group is located farthest from the pixel area,
one of the dummy lines corresponding to the first vertical contact extends a longest length, and
no dummy line corresponding to the n-th vertical contact exists or a dummy line corresponding to the n-th vertical contact extends a shortest length.

10. The image sensor as claimed in claim 8, further comprising an additional dummy line connected to any one of the middle interconnections, wherein:
every n middle interconnections form a group, and every n through vias form a group,
a first middle interconnection of the middle interconnections included in any one group is longest along the second direction, and an n-th middle interconnection of the middle interconnections included in the any one group is shortest along the second direction,
an additional dummy line corresponding to the n-th middle interconnection extends a longest length, and
no additional dummy line corresponding to the first middle interconnection exists or an additional dummy line corresponding to the first middle interconnection extends a shortest length.

11. The image sensor as claimed in claim 5, wherein:
through vias are in the peripheral area, the through vias being connected to the plurality of second interconnection lines and extend in the second semiconductor chip,
the plurality of second interconnection lines are connected to an analog-to-digital converter through the through vias, the analog-to-digital converter being located on the second semiconductor chip.

* * * * *